(12) United States Patent
Luk et al.

(10) Patent No.: US 6,191,989 B1
(45) Date of Patent: Feb. 20, 2001

(54) CURRENT SENSING AMPLIFIER

(75) Inventors: Wing Kin Luk; William Robert Reohr, both of Chappaqua, NY (US); Roy Edwin Scheuerlein, Cupertino, CA (US)

(73) Assignee: International Business Machines Corporation, Armonk, NY (US)

( * ) Notice: Under 35 U.S.C. 154(b), the term of this patent shall be extended for 0 days.

(21) Appl. No.: 09/520,668

(22) Filed: Mar. 7, 2000

(51) Int. Cl.[7] .................................................. G11C 11/22
(52) U.S. Cl. ......................... 365/207; 365/66; 365/208; 365/209
(58) Field of Search ............................. 365/66, 207, 208, 365/209, 230.07

(56) References Cited

U.S. PATENT DOCUMENTS

| 5,793,697 | 8/1998 | Scheuerlein | 365/230.07 |
| 6,091,625 | * 7/2000 | Braun et al. | 365/207 |

OTHER PUBLICATIONS

A 10ns Read and Write Non–Volatile Memory Array Using a Magnetic Tunnel Junction and FET Switch in each Cell, R. Scheuerlein et al., ISSCC 2000/Sessuib 7 /TD: Emerging Memory & Device Technologies/ Paper TA.2, 2000 IEEE International Solid–State Circuits Conference, pp. 128–129.

* cited by examiner

Primary Examiner—Terrell W. Fears
(74) Attorney, Agent, or Firm—Wayne L. Ellenbogen

(57) ABSTRACT

A current sensing amplifier for detecting a small current difference between a pair of variable resistance loads comprises a first amplifier and a second amplifier. The first amplifier comprises a voltage clamp including first and second outputs, the voltage clamp being coupled to the pair of variable resistance loads and substantially fixing a predetermined voltage across the variable resistance loads, the voltage clamp transferring the measured current difference to the first and second outputs. The first amplifier further includes a differential current source coupled to the first and second outputs. The second amplifier includes first and second inputs and an output, the first and second inputs being coupled to the first and second outputs, respectively, of the first amplifier. The current sensing amplifier detects small positive and/or negative differences in current developed between two variable resistance loads and converts the current difference into an output signal commensurate with standard CMOS logic levels. Sensing speeds are improved further by equalizing predetermined internal nodes of the sensing amplifier prior to sensing a new signal.

23 Claims, 13 Drawing Sheets

DIFFERENTIAL AMPLIFIER WITH HYSTERESIS

CURRENT SENSING AMPLIFIER

STATEMENT OF GOVERNMENT RIGHTS

This invention was made with Government support under grant contract number MDA972-96-C-0030 awarded by the Defense Advanced Research Projects Agency (DARPA) of the U.S. Department of Defense. The Government has certain rights in the invention.

BACKGROUND OF THE INVENTION

1. Field of the Invention

The present invention relates generally to current sensing circuits, and more particularly relates to a two-stage current sensing amplifier capable of detecting small differences in current between two resistances connected to the amplifier.

2. Description of the Prior Art

As described in the article entitled "A 10 ns Read and Write Non-Volatile Memory Array Using a Magnetic Tunnel Junction and FET Switch in Each Cell" (ISSCC 2000, Scheuerlein et al.), recent advances in magnetic materials have made magnetic memories, which employ a Magnetic Tunnel Junction (MTJ) memory element in each memory cell, viable contenders for the non-volatile memory market. Desirable characteristics of MTJ based memories include high integration density, high speed, low read power, and SER immunity. Features like these could also advantage MTJ based memories in traditional memory markets dominated by SRAM and DRAM technology. However, in order for an MTJ based memory to compete with these other entrenched technologies, its read access time must be reduced. The present state-of-the-art read access time is "10 ns," as noted in the paper by Scheuerlein et al. noted above. It is primarily dominated by the time required for sense amplifier circuits to detect the binary state of the data stored in the individual memory cells, once the cells have been selected for read access within the memory array grid.

There remains a need, therefore, in the field of current sensing circuitry, for a current sensing amplifier that not only significantly reduces sensing time, but also reduces the power consumed in the sensing operation. Furthermore, there is a need in the prior art for a current sensing amplifier that can be fabricated on a semiconductor chip using reduced physical area and having a reduced sensitivity to device mismatches, among other environmental factors.

OBJECTS AND SUMMARY OF THE INVENTION

It is an object of the present invention to provide a sensing amplifier that detects small variations in current between two resistances.

It is another object of the present invention to provide a sensing amplifier that performs a high speed current comparison between the two resistances.

It is yet another object of the present invention to provide a current sensing amplifier having a symmetrical configuration to reduce the effects of integrated circuit processing and related variations.

It is a further object of the present invention to provide a current sensing amplifier that is small in physical area and consumes a substantially small amount of power.

The present invention revolutionizes the field of current sensing by providing a current sensing amplifier that not only significantly reduces the overall sense time, but also reduces the power consumed in the sensing operation, the physical area of the sensing amplifier, and the overall sensitivity of the circuit to device mismatches and other environmental factors. These and other improvements are made possible, at least in part, by the integration of self-biased active load field effect transistor (FET) devices and equalization FET devices. The improved current sensing amplifier of the present invention can be employed in a wider range of sensing and measurement applications than just in MTJ based memories. In general, the invention may be applied to the detection of positive and negative signal differences arising between any two resistive loads.

In accordance with one embodiment of the present invention, a current sensing amplifier is provided which comprises a first amplifier, for detecting small differences in current between a pair of resistance loads connected thereto, and a second amplifier for providing enhanced gain and CMOS output voltage levels. The first amplifier includes a voltage clamp operatively connected to a pair of variable resistance loads. The voltage clamp substantially fixes a predetermined voltage across the variable resistance loads and translates a current difference between the loads, superimposed on a common mode current carrier, into a measurable output voltage. The first amplifier further includes a current source operatively connected to the voltage clamp. The current source supplies a constant current to the pair of variable resistance loads, such that the currents in each load are substantially equal to each other. The second amplifier is preferably a high speed gain stage configured as a conventional differential amplifier capable of providing standard CMOS voltage output levels.

These and other objects, features and advantages of the present invention will become apparent from the following detailed description of illustrative embodiments thereof, which is to be read in connection with the accompanying drawings, wherein like elements are designated by identical reference numerals throughout the several views.

DETAILED DESCRIPTION OF THE PREFERRED EMBODIMENTS

Figure 1:
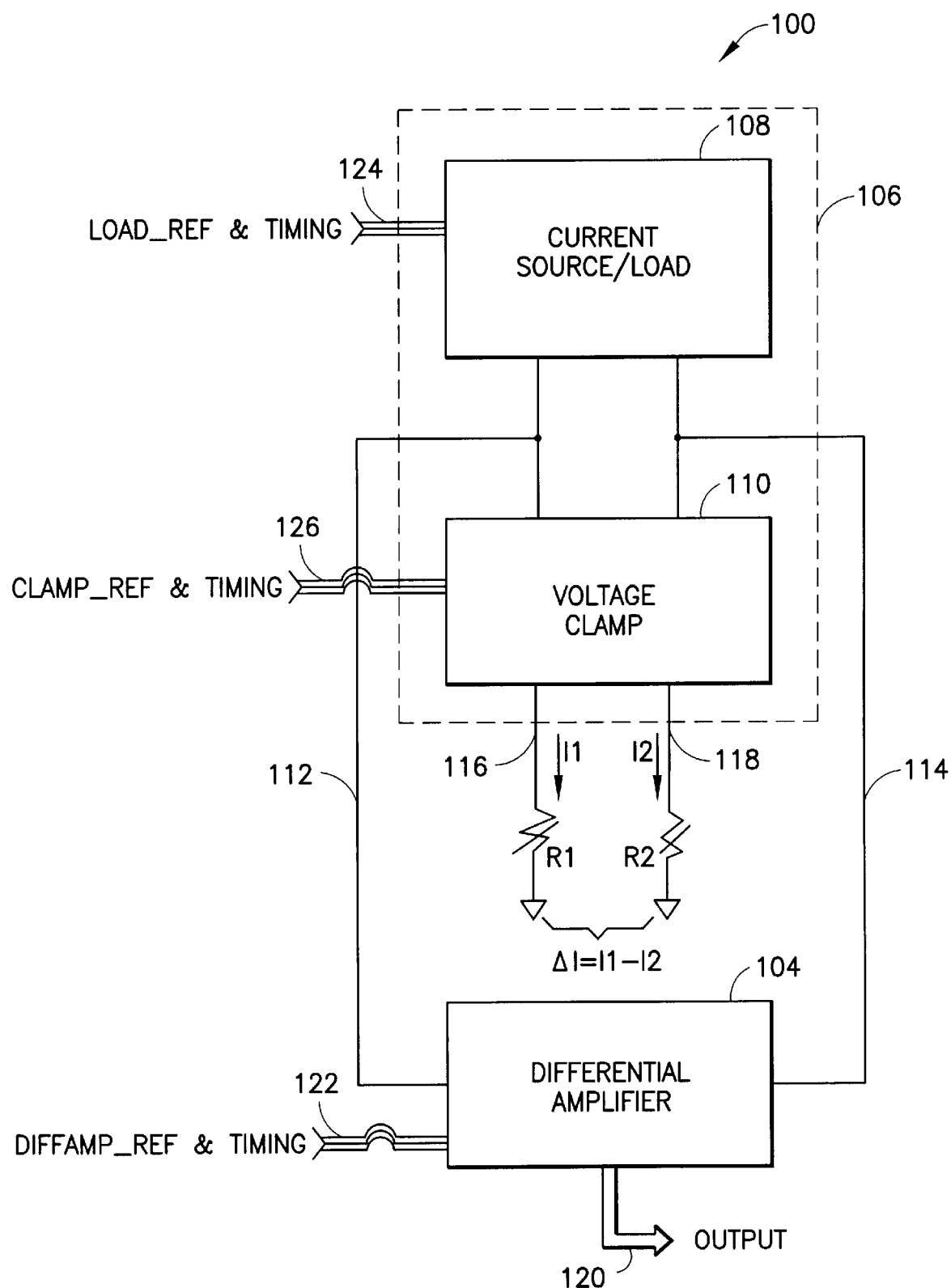
FIG. 1 is a block diagram illustrating a current sensing amplifier formed in accordance with a preferred embodiment of the present invention.

FIG. 1 is a block diagram which generally illustrates a simple current sensing amplifier formed in accordance with one embodiment of the present invention. Preferably, the current sensing amplifier performs a high speed current comparison between a pair of variable resistance loads, designated as R1 and R2, operatively connected to the sensing amplifier. As appreciated by those skilled in the art, assuming the voltage across both load resistances (e.g., R1 and R2) is substantially the same, then any difference in current between the two resistances R1, R2 will indicate a difference in resistance between the loads. For example, given a fixed voltage across the resistance load pair R1, R2, if a current I1 flowing through load R1 is greater than a current I2 flowing through load R2, the resistance of load R2 must be greater than the resistance of load R1. In this manner, the present invention can preferably be used to measure small differences in resistance between two variable resistance loads operatively connected to the current sensing amplifier.

With continued reference to FIG. 1, the current sensing amplifier 100 preferably comprises a preamplifier 106 and a differential amplifier 104. The preamplifier 106 is preferably configured as a current differential amplifier that is capable of detecting small differences in current flowing through a differential input of the preamplifier. These small differences in current are preferably translated into a voltage difference by the preamplifier 106, which is subsequently amplified by the differential amplifier 104 operatively coupled to a differential output 112, 114 of the preamplifier 106. The differential amplifier 104 is preferably a conventional single-stage differential amplifier, as known by those skilled in the art, although other suitable voltage amplifier configurations may be employed. Preferably, the differential amplifier 104 provides an output voltage level capable of driving one or more CMOS logic devices.

At this level of abstraction, it should be noted that one important distinction between the embodiment of the present invention and that of the prior art (in particular, U.S. Pat. No. 5,793,697), relates to the addition of timing signals and the removal of certain reference signals which feed the preamplifier 106 and the differential amplifier 104 of FIG. 1. Further topological differences will become apparent as the transistor implementations of FIG. 1 are described with reference to FIGS. 2, 4, 5, 7, and 9.

As shown in FIG. 1, the preamplifier 106 preferably includes a voltage clamp 110 operatively connected to a corresponding current source/load 108. The junction of the current source/load 108 and the voltage clamp 110 preferably forms the differential output 112, 114 of the preamplifier 106. Furthermore, the voltage clamp 110 is preferably coupled to the variable resistance load pair, R1 and R2, at the inputs to the preamplifier 106, formed by nodes 116 and 118 respectively.

As discussed above, within the preamplifier 106, the voltage clamp 110 preferably extracts a current difference $\Delta I$ from the variable resistance loads, R1 and R2, by fixing the voltage on input nodes 116 and 118 to substantially the same value, thus forcing the voltage drops across the resistance loads R1, R2 to be essentially equal. As appreciated by those skilled in the art, less current will flow through the load having the higher resistance, and vice versa. Ideally, the voltages across the two variable resistance loads R1, R2 are exactly matched, thus any slight variation in current between the two loads would directly correspond to a difference in resistance between the loads. Although the voltage drops across the two resistance loads R1, R2 are typically never precisely equal, it is important that these two voltage drops be as closely matched as possible, thereby increasing the overall sensitivity of the current sensing amplifier 102.

An important function of the current source/load 108 is to preferably provide substantially constant and equally matched reference currents I1, I2 in each of the load resistances R1, R2 respectively. The voltage clamp 110, furthermore, transfers the reference currents I1 and I2 to the current source/load 108 where the aforementioned current difference $\Delta I$ between the two resistance loads R1, R2 is converted to a voltage difference across nodes 112 and 114, which is then preferably amplified by the differential amplifier 104.

As discussed above, the differential amplifier 104 preferably amplifies the voltage difference signal produced at the outputs 112, 114 of the preamplifier 106. Generally, the preamplifier 106 does not generate a large enough voltage swing to properly drive a CMOS logic device. Consequently, the forward gain of the current sensing amplifier 100 is developed in stages, first through preamplifier 106 and then through the differential amplifier 104. The differential amplifier 104 also improves the slew rate of the current sensing amplifier output signal, thus decreasing the amount of time that subsequent CMOS logic devices, driven by the current sensing amplifier 100, spend in a transition state.

In the context of the present discussion, the term "variable resistance load" (R1 and R2) connotes that the resistance of the loads R1, R2 may be a function one or more state variables. An example will serve to develop this concept more clearly. A magnetic tunnel junction device (MTJ) can be used as a storage element in a compact memory cell, since the state of its free magnetic moment, at least in part, determines its resistance. A detailed discussion of the MTJ device may be found, for example, in U.S. Pat. No. 5,640,343 to Gallagher et al., and thus will not be presented herein. However, other state variables, such as temperature and applied voltage, may also influence the resistance value of the MTJ device. Thus, particularly in memory applications, it is important that these variables be regulated adequately.

A number of variations of, or modifications to, the present invention are contemplated which aim to optimize different design criteria, such as speed, physical compactness, power consumption, and noise immunity. For example, a sense amplifier with a fully symmetric current source/load 108 can achieve higher speed and greater transient noise immunity than amplifier with an asymmetric current source/load, but the amplifier with the asymmetric current source/load is typically more compact than the amplifier with the symmetric current source/load 108. It is also contemplated that reference/bias voltages and/or timing actuation signals may be supplied to the subcomponents of the sense amplifier 100 to improve one or more aspects of the overall design. For example, the differential amplifier 104, current source/load 108 and voltage clamp 110 may receive reference and timing signals 122, 124 and 126, respectively. Further design tradeoffs will be revealed herein below as transistor level embodiments of the invention are discussed. The preamplifier 106 will now be described in greater detail.

Figure 2:
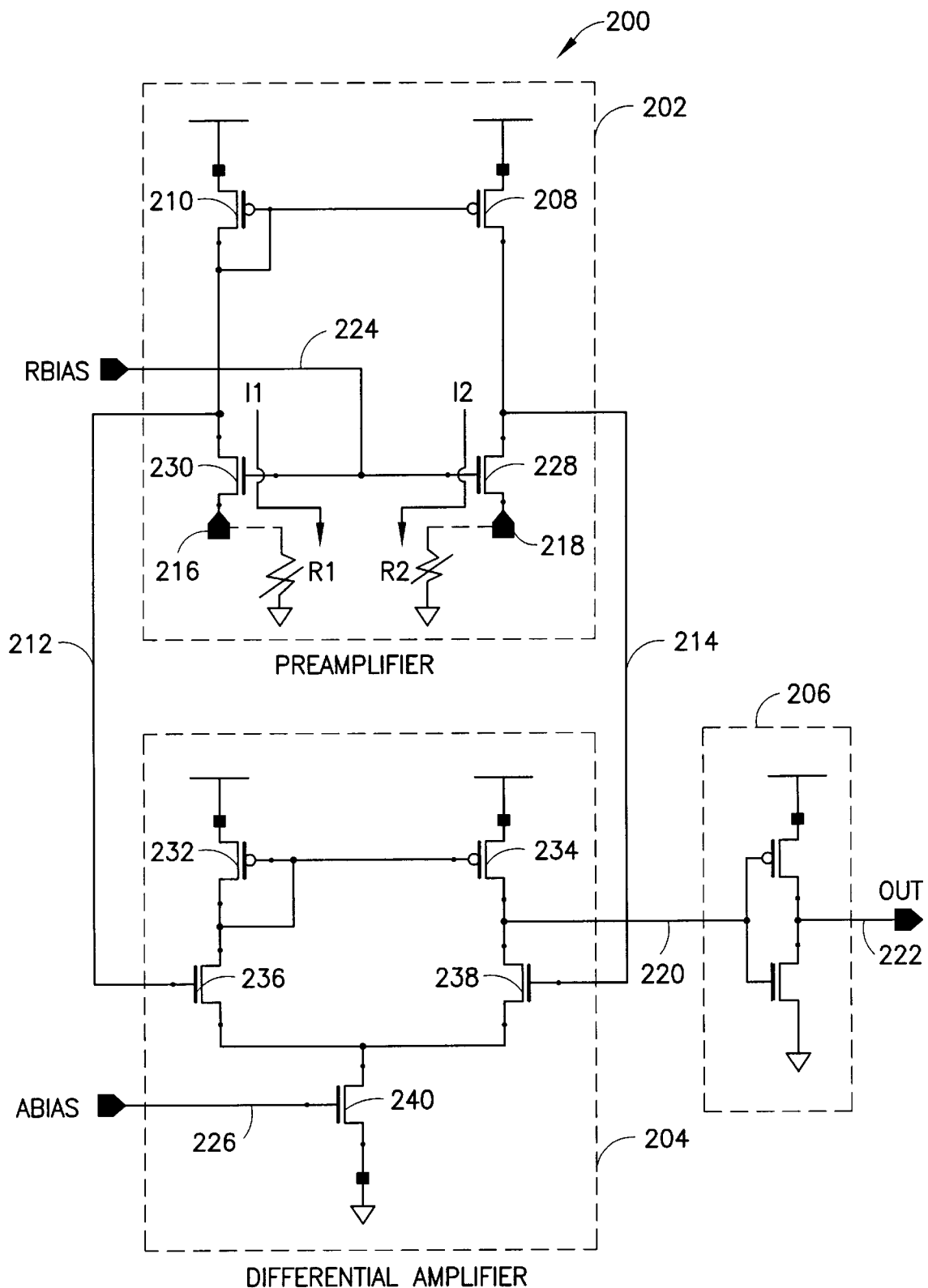
FIG. 2 is an electrical schematic diagram illustrating one embodiment of the current sensing amplifier depicted in FIG. 1.

FIG. 2 illustrates an electrical schematic diagram of one embodiment of a current sensing amplifier 200 formed in accordance with the present invention. With reference to FIG. 2, the current sensing amplifier 200 preferably comprises a preamplifier 202, having differential input nodes 216, 218 and differential output nodes 212, 214. The current sensing amplifier 200 further comprises a conventional differential amplifier 204, preferably having a differential input, connected to output nodes 212, 214 of the preamplifier 202, and a single-ended output 220, although other amplifier configurations are similarly contemplated. It should be appreciated that the output 220 of the differential amplifier 204 may be connected to subsequent amplification or logic stages, such as, for example, a simple CMOS inverter 206, in order to further shape the output signal as required for a particular application (e.g., providing enhanced slew rate, voltage level shifting, etc.) It should be emphasized that, although a CMOS inverter 206 is employed in FIG. 2, the present invention does not preclude the use of other logic devices or circuits, such as multiplexers, latches, tri-state devices/circuits, or the like, either in place of the inverter 206 or in combination therewith.

With continued reference to FIG. 2, the voltage clamp of the preamplifier 202 is preferably realized as a pair of n-channel field effect transistor (NFET) devices 228, 230, although other suitable devices (e.g., bipolar junction transistors, etc.) or configurations are contemplated by the present invention. The NFET pair 228, 230 is preferably connected in such a manner that the gate terminals of each device are connected together at node 224 and the source terminals of each device 228, 230 form the differential inputs 218, 216 respectively of the preamplifier 202. As discussed above, the two variable resistance loads to be measured, namely, R1 and R2, are connected to the differential inputs 216, 218 respectively, of the preamplifier 202.

Preferably, in order to establish a predetermined fixed operating voltage across the two variable resistance loads R1, R2, a bias voltage "rbias" is connected to the common gate node 224 of the voltage clamp devices 228, 230. The desired bias voltage is preferably externally generated, either off-chip or on-chip, by a suitable reference generator or bias source (not shown). Alternatively, the present invention contemplates that the desired bias voltage, rbias, may be generated locally, within the preamplifier cell 202 itself (not shown), as appreciated by those skilled in the art. Suitable reference generators for use with the present invention are well known in the art and include, for example, bandgap references, threshold voltage ($V_t$) references, etc.

As previously mentioned, the bias voltage, ibias, should be substantially constant in order to regulate the voltage drop across the variable resistance load pair R1, R2. Preferably, the bias generator signal (rbias) provides enough gate-to-source voltage ($V_{gs}$) overdrive to the voltage clamp NFET devices 228, 230 such that the NFET devices 228, 230 sustain bias currents I1 and I2 through the resistance load pair R1, R2 respectively.

In the embodiment of FIG. 2, the current source/load is preferably realized as a pair of p-channel field effect transistor (PFET) devices, 208 and 210, configured as a simple current mirror. The simple current mirror configuration generally provides the most compact circuit design. However, the present invention similarly contemplates using other types of transistor devices or circuit configurations for the current source/load. As is well known by those skilled in the art, the simple FET current mirror typically comprises a pair of FET devices connected with the source terminals in common and the gate terminals in common, and wherein one of the two FET devices, generally designated as the reference device, is connected in a diode configuration (i.e., gate and drain terminals connected in common). A detailed discussion of current mirror topologies and their operation in general is provided, for example, in the text *CMOS Analog Circuit Design*, by Phillip E. Allen and Douglas R. Holberg, pp. 227–239 (Holt, Rinehart and Winston, Inc., 1987), and will therefore not be presented herein.

Comprising only four transistors (i.e., 208, 210, 228, 230), the preamplifier 202 preferably serves at least three critical functions in the current sensing amplifier 200: 1) clamping the voltage across the variable resistance pair, R1 and R2, to a desired value; 2) providing a source of current, I1 and I2, to the variable resistance load pair R1, R2; and 3) translating a current difference passing through the variable resistance load pair into a voltage difference while providing an amplified differential voltage signal level at the outputs 212, 214 of the preamplifier 202. A more detailed discussion of these three functions is presented herein below, using, as an example, the current sensing amplifier embodiment of FIG. 2.

With continued reference to FIG. 2, the bias voltage, rbias, in essence, adjusts the voltage at the inputs 216, 218 of the current sensing amplifier 200 via the voltage clamp NFET devices 230 and 228, respectively. The voltage clamp NFETs 228, 230 are preferably operated in the saturation region so that the gate voltage of each NFET device 228, 230 substantially controls its source voltage, allowing its drain voltage to swing within a certain predefined range. Each variable resistance load (e.g., R1, R2) within a particular load cell pair being sensed, essentially sees the full clamp voltage across it (i.e., from node 216 to ground, or from node 218 to ground).

As a consequence of the difference in resistance values between the resistance load pair R1 and R2, the currents passing through each side of the preamplifier 202 will be different. The difference in currents flowing through the two resistance loads R1, R2 is converted, at the outputs 212, 214 of the preamplifier 202, into a difference in voltage primarily by the PFET devices 210 and 208, which function as current source/load for the voltage clamp stage. A first or reference bias current preferably traverses from the positive VDD supply through PFET device 210, through NFET device 230, and finally into first variable resistance load R1. Similarly, a second bias current preferably traverses from the VDD supply, through PFET 208, through NFET 228, and finally into second variable resistance load R2. The first current path preferably establishes the operating point, or common mode voltage, of the preamplifier on output node 212. A beneficial consequence of the circuit topology shown in FIG. 2 is that the reference PFET device 210 is diode connected, so the reference voltage established by it is restricted to a relatively narrow band of operation, even though the bias current through it may vary widely.

As is known in the art, the source-to-drain and gate voltage across a diode connected FET device varies as the square root of the current passing through it. Hence, the diode connected PFET 210 establishes a reliable common mode voltage to bias the differential amplifier 204, in accordance with the saturation current square law relationship (redefined in terms of VSD for PFET device 208) shown below.

$V_{SD}=V_{SG}$ (resulting from the diode connection)

$V_{SD}=(I_{SD}/K)^{1/2}+|V_T|$

For the sake of this discussion, it can be assumed that the current I1 flowing through PFET device 210 includes only a common mode component while the current I2 flowing through PFET device 208 includes both a common mode component and a difference signal component ΔI (i.e., the current difference information is substantially contained in current I2). During switching of preamplifier 202, when nodes 212 and 214 are substantially equal, the PFET device 208 preferably operates in the saturation region by the nature of its connection as a current mirror to reference PFET device 210. During this time, the current difference ΔI passing through PFET device 208 sees a high differential (or small signal) resistance, $R_{diff}$, looking into output node 214, and thus a high level of voltage gain. The current difference ΔI is thus transformed into a voltage difference, $V_{diff}$, that swings about a common mode voltage on output node 214, as set by the diode connected reference PFET device 210. The voltage difference, $V_{diff}$, carries the desired signal, which can be at least approximately expressed as a function of the current difference ΔI and the differential resistance, $R_{diff}$ on output node 214 as follows:

$V_{diff}=R_{diff}*\Delta I$ and $\Delta I=I1-I2$ $R_{diff}=r_{dsP}\|(g_{mN}*r_{dsN}*R2)$ where $g_{mN}$ is the small signal transconductance of voltage clamp NFET device 228, $r_{dsN}$ is the small signal drain-to-source resistance of voltage clamp NFET device 228, and $r_{dsP}$ is the small signal drain-to-source resistance of mirror PFET device 208.

By way of example, the combined small and large signal operation of the current sensing amplifier 200 will be discussed, in relation to an exemplary response of the current sensing amplifier of FIG. 2. In the present example, it is assumed that a CMOS process technology is used which includes the following attributes: 1.8V CMOS; 0.18 um lithography; Leff=0.11 um; and 400 mV (NFET) and 500 mV (PFET) threshold voltages. A clamp voltage of 200 mV is applied across the variable resistance loads (R1, R2), connected to the input nodes 216, 218 of the current sensing amplifier, by supplying an appropriate bias voltage, rbias, to the common gate node 224 of the voltage clamp devices 228, 230.

For simulation purposes, one of the two variable resistance loads (R1 or R2) is assumed to have a resistance of 4K ohms, while the other variable resistance load is assumed to have a resistance of 4.4K ohms. Using the above parameters, current source/load PFET devices 210 and 208 were found to source 50 uA and 45 uA (I1 and I2), respectively, to the two variable resistance loads (R1 and R2). The voltage gain is preferably staged within the current sensing amplifier to achieve an optimum balance between speed and noise immunity. The preamplifier preferably amplifies the equivalent of a 20 mV signal (e.g., 10% ΔR at 200 mV) by a gain of about eleven (11×) to achieve a desired 220 mV voltage difference signal across preamplifier output nodes 212 and 214.

In addition to providing differential-to-single-ended conversion, the differential amplifier 204 preferably amplifies the difference signal by a gain of 6.5 to provide an output signal of about 1.44 volts on the output node 220 of the differential amplifier 204. The final CMOS inverter gain stage 206 preferably drives the output signal 222 of the current sensing amplifier 200 either to about 1.8 volts or to zero volts, depending on the relative value of load resistance R1 when compared to R2 (i.e., the logic state of the amplifier). The inverter 206 also provides increased output current source/sink capability for driving more heavily loaded nodes, or a greater number of devices connected to the output 222 of the current sensing amplifier 200 (i.e., increased fan-out).

From a performance standpoint, ideally, as previously discussed, the current source/load (configured as a current mirror) provides a mirrored current that precisely matches the reference current established by the reference FET device. However, even if both FET devices in the current mirror are exactly matched, many factors may contribute to a mismatch between the two currents. One such contributing factor is a mismatch between the drain-to-source voltages ($V_{ds}$) of the two current mirror FET devices. Using the simple current mirror arrangement for the current source for preamplifier 202 of FIG. 2, as the high impedance output node 214 swings up and down in voltage, a mismatch will occur with respect to the other output node 212, which, due at least in part to the diode connection, is fixed at a relatively constant voltage.

Another disadvantage associated with the simple self-biasing current source scheme of FIG. 2, is that the low impedance output node 212 is loaded by the additional gate capacitance of PFET devices 208 and 210, in comparison to output node 214. The asymmetry introduced by the differences in capacitance between the two output nodes 212, 214 of the preamplifier 202 results in a current sensing amplifier that is more sensitive to transient noise phenomena, such as, for example, coupling. Of course, asymmetries of this type will ultimately degrade the speed of current sense amplifier 200. Even so, its advantages of simplicity and compactness may validate its use in some applications.

In order to minimize the amount of mismatching between the reference current and the mirrored current, particularly in terms of its transient characteristics, a symmetrical arrangement of the current source/load is preferably employed. In an alternative embodiment of the present invention, the current source/load shown in FIG. 2 is preferably modified by removing the diode connection (i.e., gate-to-drain connection) on PFET device 210. Since this arrangement is no longer self-biasing, an additional bias voltage, Lbias (not shown), must be supplied to the common gate node (no longer connected to output node 212) of the PFET devices 208, 210, either by the same bias generator circuit supplying the bias voltage rbias, or any other suitable bias source. The voltage level of the load bias signal preferably establishes a source-to-drain conductance in the PFET devices 210, 208 such that they are operating primarily in the saturation region. Preferably, these PFET devices 210, 208 will only fall into the linear (i.e., non-saturation) region of operation when the difference current from the variable resistance load pair, R1, R2, substantially exceeds the level required for robust amplification.

In this manner, the capacitances on each of the two output nodes 212, 214 will be the same, and hence the "high-to-low" or "low-to-high" transient response of the circuit will be essentially balanced, thus increasing the overall response time of the circuit. Unfortunately, the common mode operating point of this embodiment will be less well defined than if it had been established by a diode connected PFET device 210.

Figure 3:
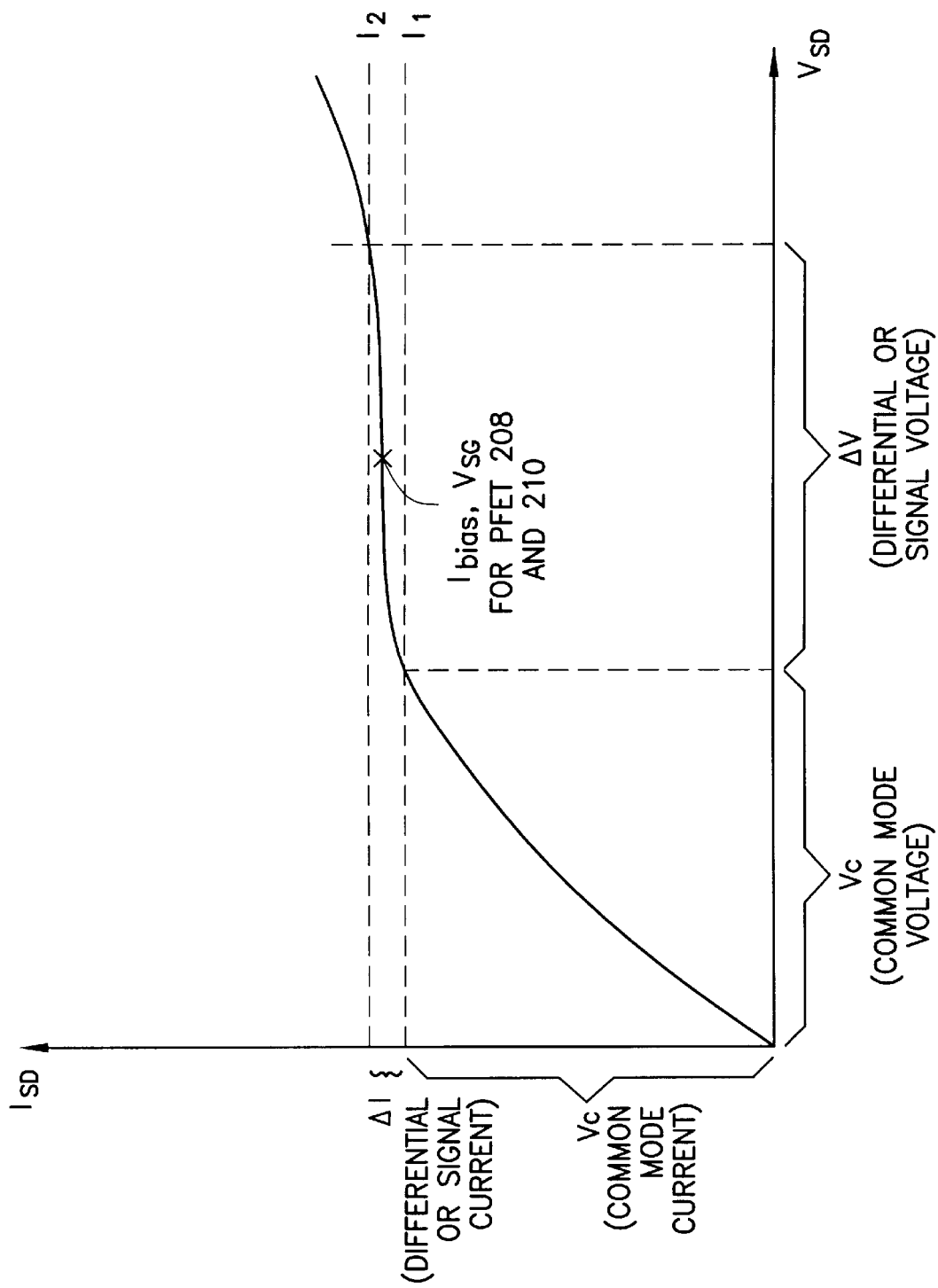
FIG. 3 is a graphical representation illustrating an output characteristic curve for a modified version of the current source/load implementation shown in FIG. 2.

FIG. 3 is a graphical representation illustrating how "ideal" amplification is achieved within the modified symmetrical configuration of the preamplifier 202 of FIG. 2. In general, FIG. 3 shows a plot of the magnitude of drain current versus drain-to-source voltage for the load PFET devices 208, 210. By fixing the gate-to-source voltage of the two devices 208, 210, load bias voltage, Lbias, preferably establishes a plateau for small signal amplification on the output nodes 214, 212, respectively, of the preamplifier 202. Small differences between the resistance load currents I1 and I2 ranging from about 5% to 20%, for example, are preferably translated into more measurable voltage differences, preferably by the high differential resistance of the PFET devices 210 and 208, which are primarily operated in the saturation region during amplifier switching.

With continued reference to FIG. 3, on the y-axis, which represents the magnitude of drain-to-source current, signal currents I1 and I2 are decomposed into a common mode current component, $I_C$, and a differential current component, $\Delta I$. The differential current component, $\Delta I$, is preferably superimposed onto the common mode current component, $I_C$, and its sign indicates the relative resistance value of R1 compared with that of R2. As defined in FIG. 2, if the differential current component is negative (i.e., I1<I2), then it follows that R1 is greater than R2. Similarly, if the differential current component, $\Delta I$, is positive (i.e., I1>I2), as shown in FIG. 3, R1 is smaller than R2. Likewise, it follows that the sign of the differential voltage, $\Delta V$, depicted on the x-axis, indicates the relative resistance of R1 compared with that of R2.

It should be appreciated that, as shown in FIG. 3 and discussed herein above, a fluctuation in load bias current, Tbias, of about 10%, for example, with respect to the variable resistance load currents I1 and I2, may dramatically alter the common mode operating voltage, $V_C$, developed across the current source/load transistors 210, 208 of the preamplifier 202 (see FIG. 2). As noted in FIG. 3, it would be preferable to set the load bias current to the average of I1 and I2 (or slightly less than the average). However, the load and clamp bias voltages, Lbias and rbias respectively, which in turn control the relative magnitude of Ibias with respect to the variable resistance load currents I1 and I2, have a significant interdependency in the symmetric preamplifier modification to FIG. 2.

As discussed above, load bias voltage, Lbias, preferably sets and regulates the transconductance of current source/load PFET devices 210, 208, while voltage clamp bias, rbias, preferably regulates the variable resistance load currents I1 and I2 through the variable resistance loads R1 and R2 respectively. The implication of the foregoing discussion is that the symmetric modification to the preamplifier 202 shown in FIG. 2 essentially requires a relatively precise reference voltage generator (not shown), which may involve considerable circuit complexity. What makes the symmetric preamplifier design even more costly is that the reference generator might have to be implemented locally, or perhaps even be incorporated into each current sensing amplifier cell, in order to minimize the effects of semiconductor process variations, such as, for example, device threshold voltage shifts.

It should be mentioned that, with continued reference to the current sensing amplifier embodiment of FIG. 2, the voltage on the output node 220 of the differential amplifier 204 is less sensitive to fluctuations in the tail current bias voltage, abias, connected to the gate 226 of the tail current NFET device 240, than what has been noted for the current source/load bias voltage, Lbias, of the symmetrical modification to preamplifier 202. Tail current NFET device 240 preferably sets a bias current for the input differential stage, comprising NFET devices 236, 238, that fractionally divides according to the signal voltages present at the inputs 212, 214 of the differential amplifier 204. Since the bias current for load PFET device 234 is set via reference PFET device 232, a decrease in tail current through NFET device 240 results in a proportional decrease in load current through PFET device 234.

Figure 4:
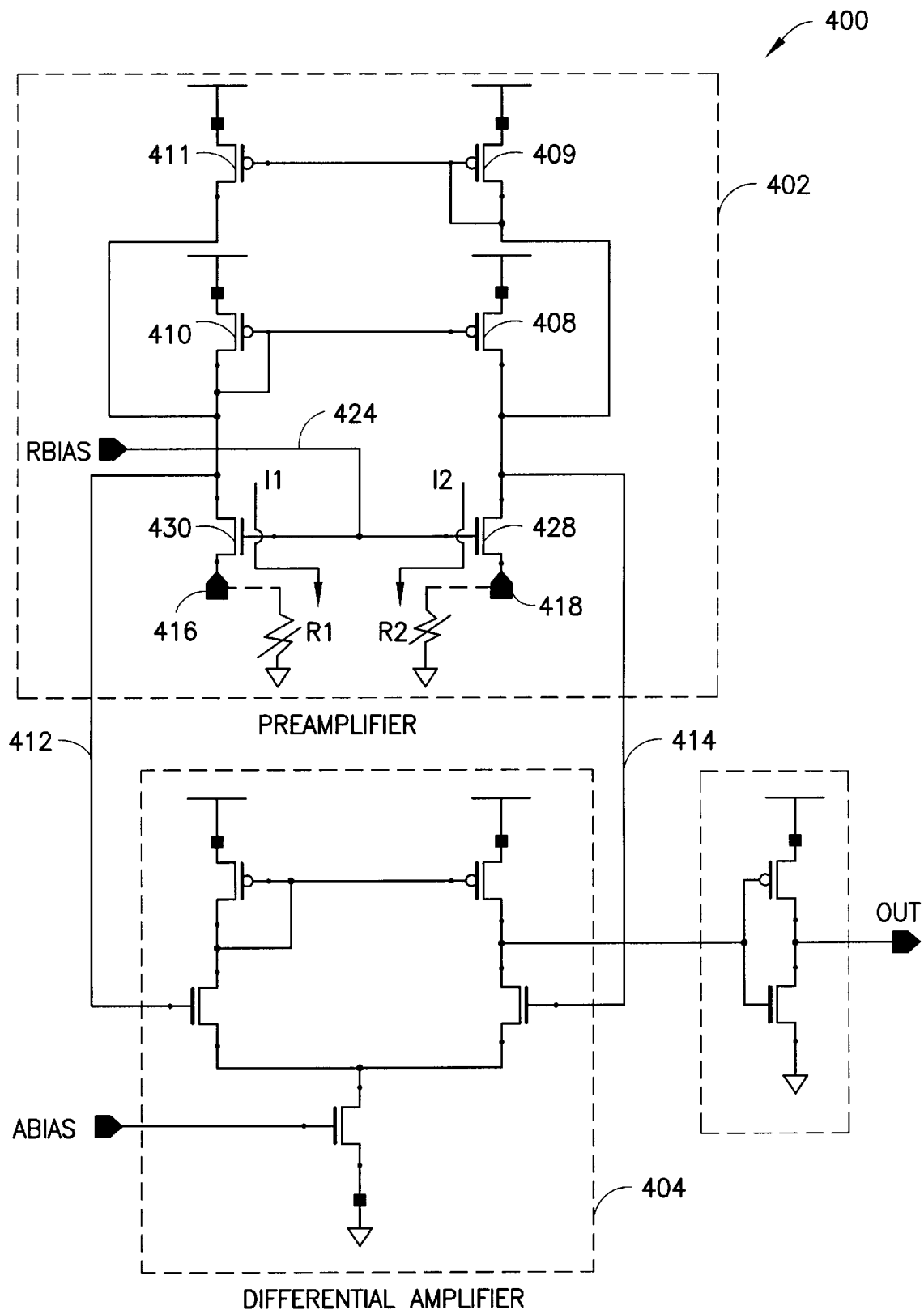
FIG. 4 is an electrical schematic diagram illustrating another embodiment of the current sensing amplifier formed in accordance with the present invention, in which the current source/load implementation comprises a pair of symmetrical, self-biased current mirrors.

Consequently, the symmetrical preamplifier arrangement illustrated in FIG. 4 is a preferred embodiment for the current sensing amplifier, formed in accordance with the present invention. In essence, the preferred current sensing amplifier of FIG. 4 includes a preamplifier which combines the symmetric modification to the current source/load of the preamplifier shown in FIG. 2 with the self-biasing preamplifier 202 of FIG. 2.

With reference to FIG. 4, there is shown a symmetrical current sensing amplifier 400 including a symmetrical preamplifier 402, having a self-biasing current source/load, and a conventional differential amplifier 404, as described herein above with respect to FIG. 2. The symmetrical load preferably comprises two simple current mirrors (a discussion of which was presented herein above with reference to FIG. 2), the first mirror comprising reference PFET device 410 and corresponding mirror PFET device 408, and the second mirror comprising reference PFET device 409 and corresponding mirror PFET device 411. The two current mirrors are preferably configured to have reference and mirror terminals cross-coupled with each other, so that output node 412 connects to the gate and drain of the first reference PFET device 410, the gate of the first mirror PFET device 408, and the drain of the second mirror PFET device 411. Likewise, output node 414 connects to the gate and drain of the second reference PFET device 409, the gate of the second mirror PFET device 411, and the drain of the first mirror PFET device 408.

The new current source/load topology introduces at least one property which differentiates it from the arrangement shown in FIG. 2. Specifically, the current source/load topology of preamplifier 402 will exhibit hysteresis if the mirror PFET devices 408 and 411 have a greater device width-to-length (W/L) ratio than the corresponding reference PFET devices 409 and 410, respectively. The relative W/L ratios of the reference and mirror PFET devices essentially determine the proportion of current flowing through each PFET. For example, a mirror PFET device having a W/L ratio that is twice that of its reference PFET device will source approximately twice the current of its reference PFET device, so long as the mirror and reference PFETs are operated substantially in the saturation region. Assuming that both current mirrors forming the current source/load of preamplifier 402 are sized accordingly, the output of the preamplifier 402 will exhibit hysteresis as the circuit responds to various levels of input currents I1 and I2.

As an illustration of hysteresis in the preamplifier 402, by way of example only, assume that the voltage at output node 414 of the preamplifier 402 is lower than that at output node 412—thus for the preceding state of the preamplifier 402, input current I2 had exceeded input current I1—and that the W/L ratio of mirror PFET device 411 is twice that of reference PFET device 409 (Likewise for mirror and reference PFET devices 408 and 410, respectively). Due to these prevailing conditions, the current mirror formed of PFET devices 409 and 411 sources the bulk of the current to output nodes 414 and 412, respectively, since reference PFET device 409 will have a larger source-to-gate voltage than reference PFET device 410. In saturation, mirror PFET device 411 will source approximately twice the current as reference PFET device 409. As a result of this current imbalance existing in the dominant current mirror (409, 410), current I1 must be larger than current I2 to drive the preamplifier 402 to the opposite state, where the voltage on output node 412 is lower than that on output node 414. If the current difference between I1 and I2 is below a predetermined threshold, the current source/load (comprised of PFET devices 408–411) will resist attempts to change the output state of preamplifier 402. The above hysteresis explanation similarly holds true if it was assumed that the preamplifier 402 had started from the opposite state.

It is to be appreciated that hysteresis may be undesirable for certain high speed sensing applications. Any inherent tendency for the preamplifier 402 to oppose an output state change may cause the amplifier to switch more slowly and to be less sensitive to input signal changes than it could otherwise be without hysteresis. Therefore, for such high speed sensing applications, in employing the preamplifier configuration of FIG. 4, hysteresis is preferably circumvented by sizing the W/L ratios of the reference PFET devices 409 and 410 to be equal to or greater than that of the mirror PFET devices 411 and 408, respectively.

Figure 5:
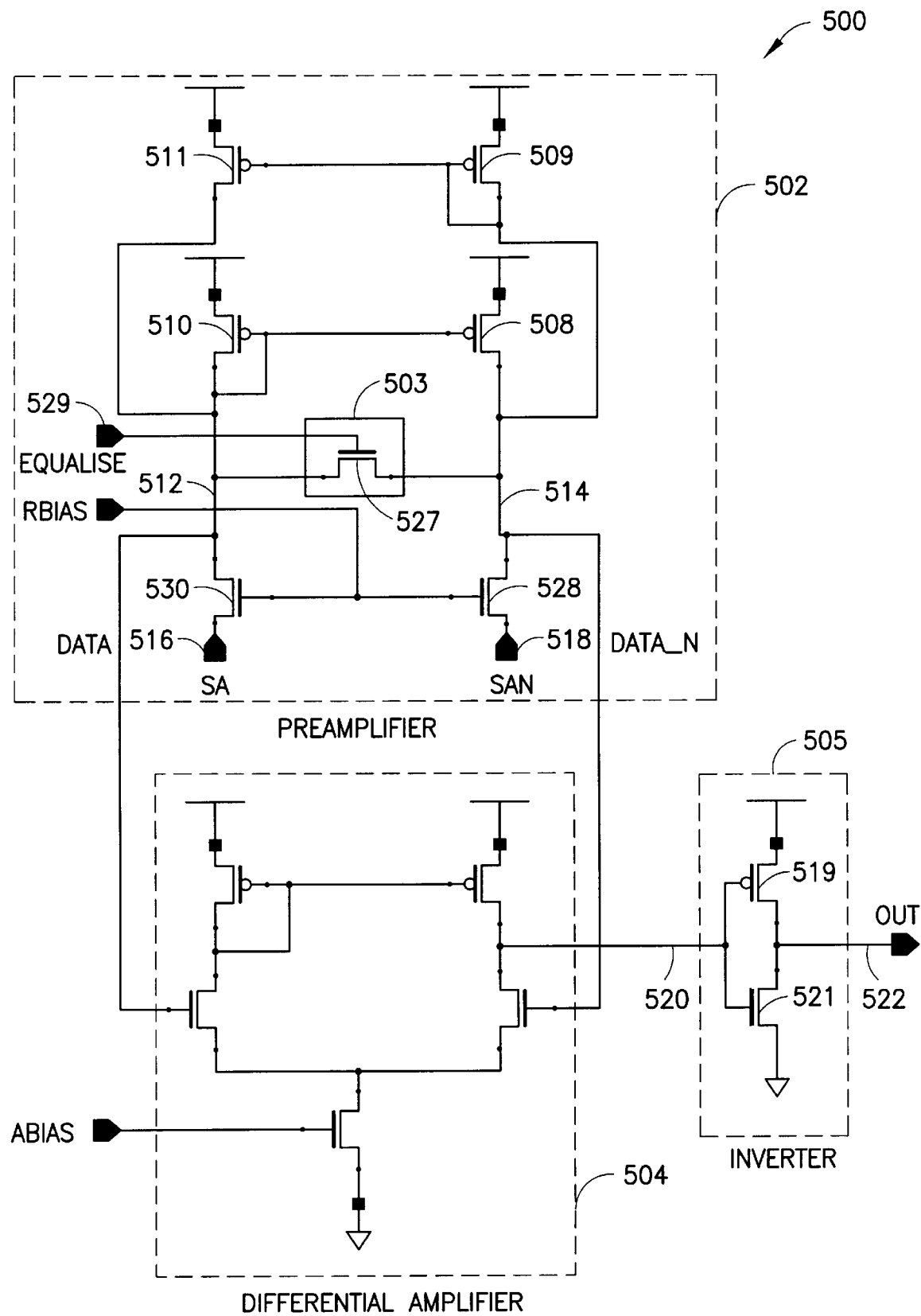
FIG. 5 is an electrical schematic diagram illustrating a preferred embodiment of the current sensing amplifier of the present invention, in which the preamplifier implementation comprises equalization circuitry.
Figure 7A:
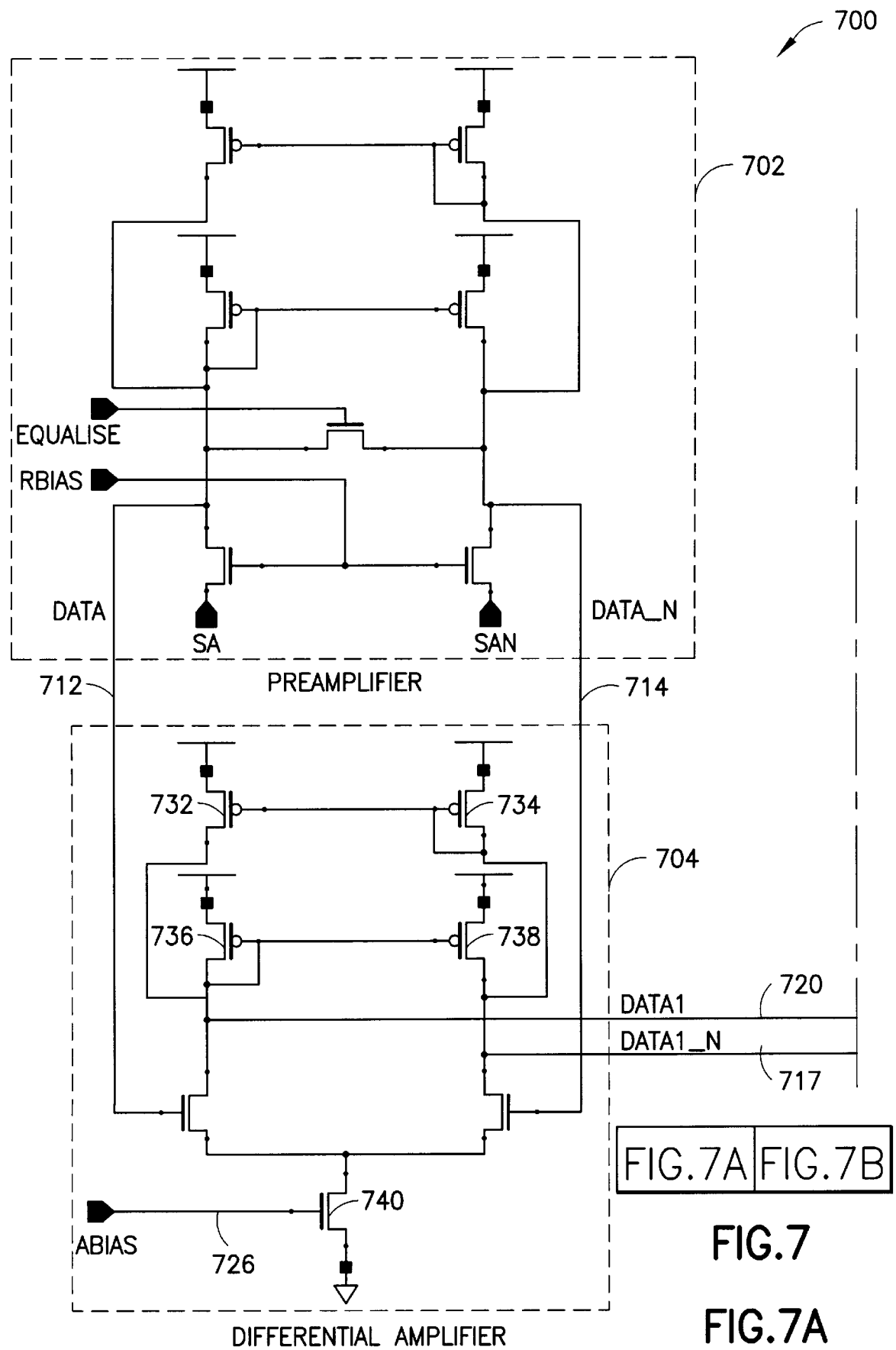
FIG. 7 is an electrical schematic diagram illustrating a preferred embodiment of the current sensing amplifier formed in accordance with the present invention, wherein the sense amplifier includes a latch circuit.
Figure 7B:
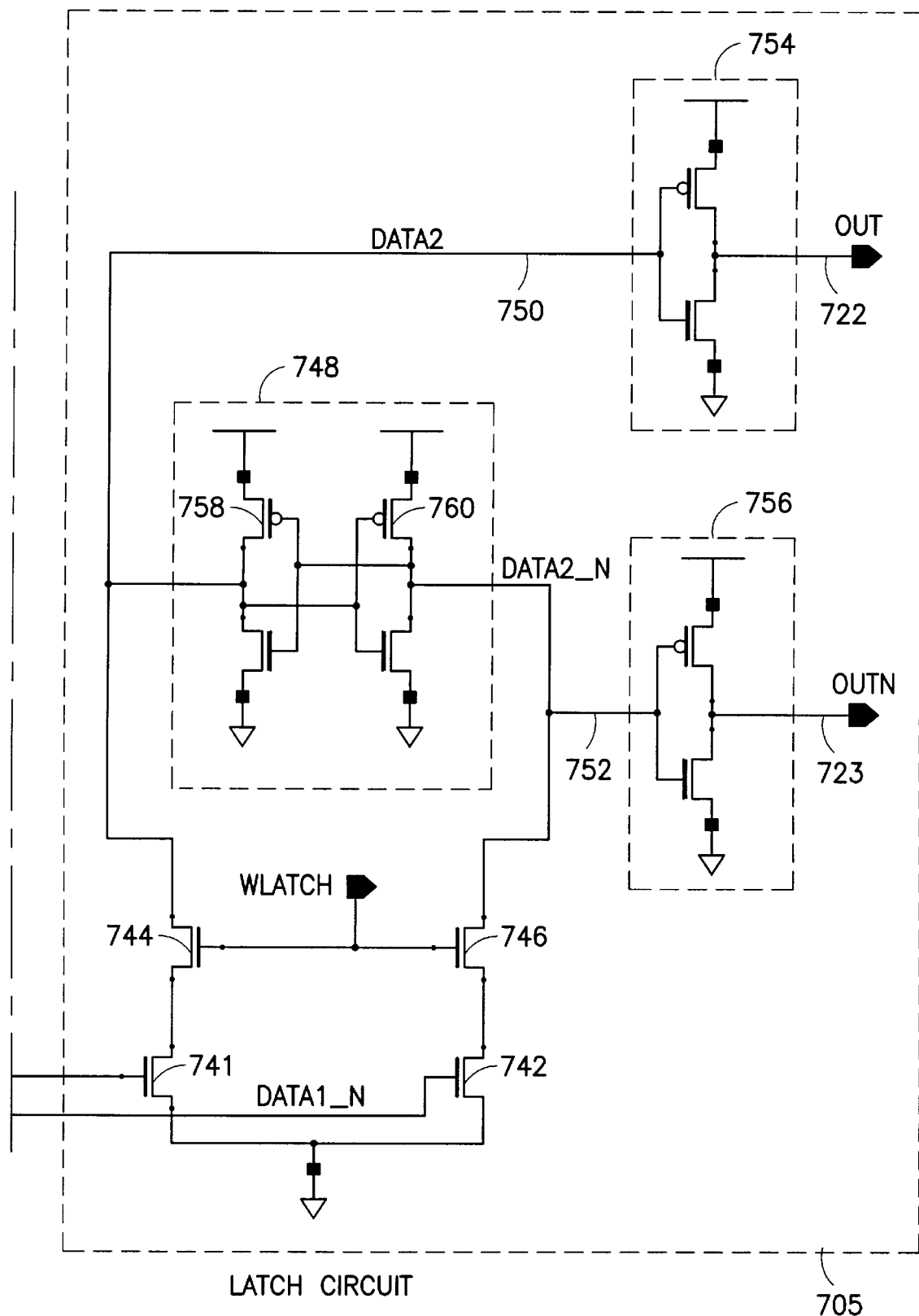
Figure 9:
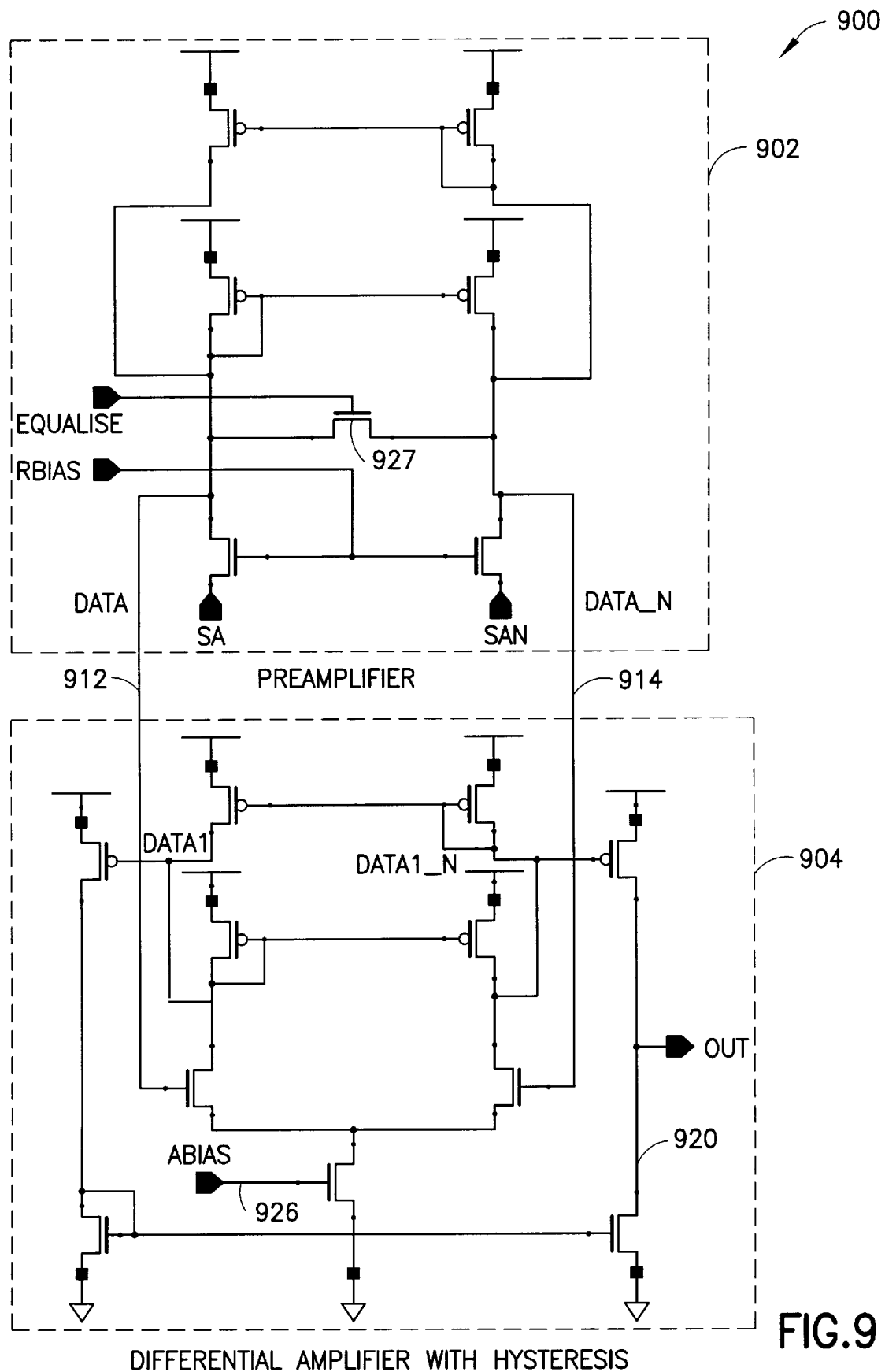
FIG. 9 is an electrical schematic diagram illustrating an alternative embodiment of the current sensing amplifier, formed in accordance with the present invention, wherein the differential amplifier implementation comprises hysteresis circuitry.

The current sensing amplifier of the present invention may include additional circuitry for enhancing the performance thereof. For instance, in a preferred embodiment of the present invention, the preamplifier may include an equalization circuit for improving speed and settling time, among other advantages. FIGS. 5, 7, and 9 illustrate how one or more timing and reference signals may be integrated within the sense amplifier of the present invention to enhance the performance of the sense amplifier and minimize power consumption.

FIG. 5 shows an equalization circuit 503 which is preferably implemented as a single NFET device 527 having its drain and source terminals connected across the output nodes 512 and 514 respectively. In the preferred embodiment, the equalization NFET device 527 functions primarily as a voltage-controlled switch which, when activated by applying an appropriate equalization signal to the gate terminal 529 of the equalization NFET device 527, essentially forces the two output nodes 512, 514 of the preamplifier 502 (and thus the inputs of the differential amplifier 504) to be substantially equal to each other. It is to be appreciated that, since the NFET device 527 is inherently bi-directional, it may also be connected with the drain and source terminals reversed. Furthermore, the present invention contemplates that a PFET device, or any other suitable equivalent thereof, may be substituted for the NFET device 527 by application of an appropriate equalization activation signal.

One advantage of making the outputs 512, 514 of the preamplifier 502 substantially equal is that the sense amplifier 500 is preferably able to perform input signal comparisons more quickly, as described in greater detail herein below using a memory cell application as an example. When the two input nodes 512, 514 of differential amplifier 504 are essentially connected together via equalization circuit 503, the differential amplifier output node 520 will preferably sit at an intermediate voltage level, preferably midway between the positive (vdd) and negative (gnd) voltage supplies. The amount of voltage that the differential amplifier 504 must slew at its output node 520, in order to reach its correct output voltage state or level, will therefore be reduced, thus increasing the overall speed of the sense amplifier 500.

Figure 6:
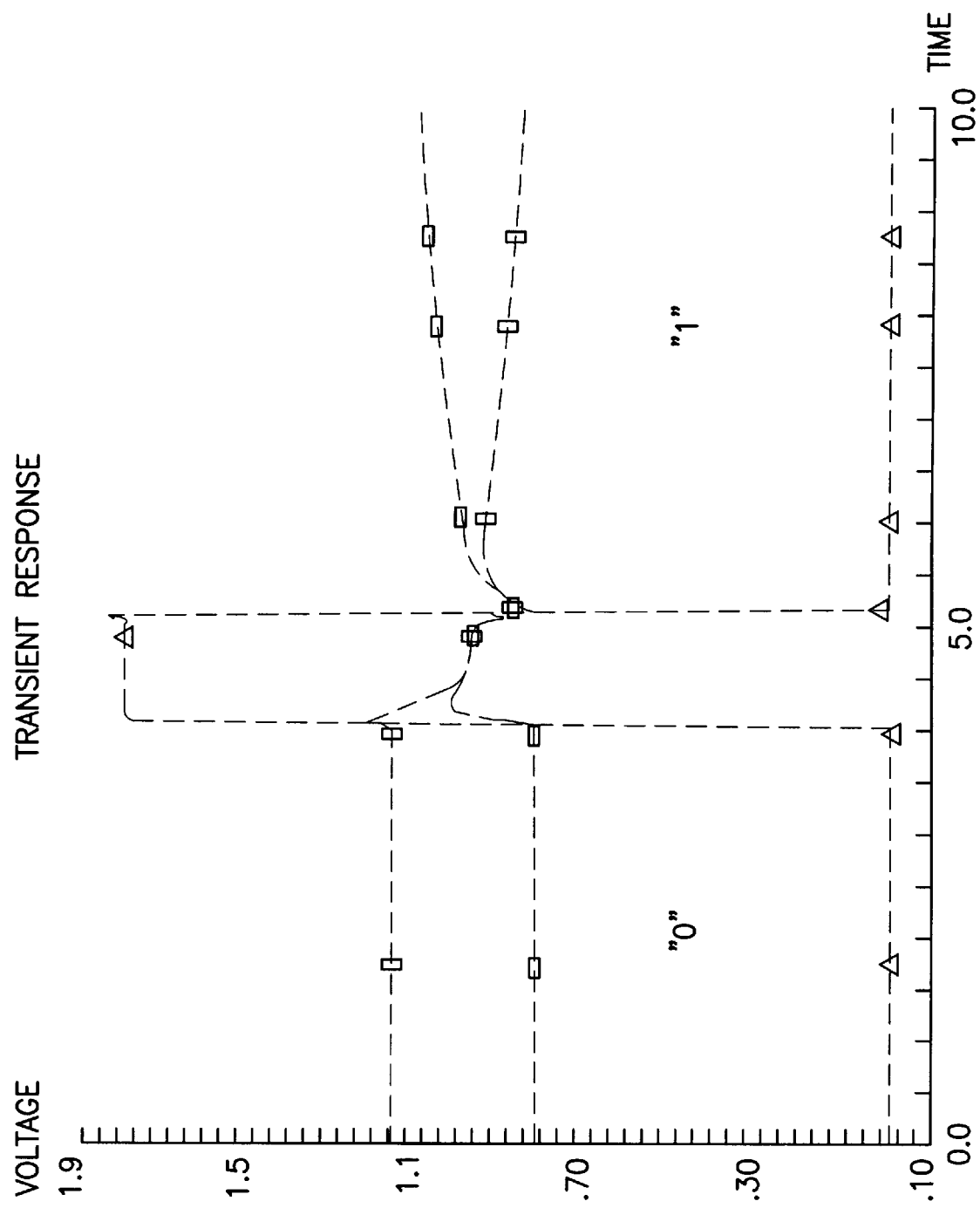
FIG. 6 is a graphical representation illustrating a transient response characteristic of the preamplifier depicted in FIG. 5, in response to a predetermined equalization signal.

With continued reference to FIG. 5, the equalization circuit 503 is shown integrated into the symmetric and self-biasing sense amplifier configuration of FIG. 4. By way of example only, a more detailed discussion of the equalization circuit embodiment of the present invention will be presented in relation to a memory cell sensing application. Prior to sensing the state of a memory cell (which is preferably represented as the variable resistance load pair R1 and R2 previously discussed) each cycle, the equalization NFET device 527 is preferably asserted by an active high equalization pulse at the "equalize" input 529 of the preamplifier 502. In response to the equalization pulse, the equalization circuit 503 preferably shorts (using the switch analogy) the output nodes 512 and 514 of the preamplifier 502 together so that their voltages are substantially equal to each other. Using this approach, the equalization circuit 503, in essence, clears the intrinsic difference voltage of the prior memory read away, thus increasing the speed at which the memory cell can be sensed or read. Therefore, the memory cell only has to supply sufficient current over a short time period to bias output node voltages 512 and 514, until a sufficient voltage difference is developed between the output nodes 512, 514 to trigger the subsequent differential amplifier stage 501, thereby changing the state of the sense amplifier. A graphical illustration of the typical transient characteristics of the output nodes 512, 514 of the preamplifier 502, in response to an equalization pulse, is shown in FIG. 6.

As previously mentioned, the shorting of the output nodes 512 and 514 of the preamplifier 502 may cause the output node 520 of the differential amplifier 501 to rise to an intermediate voltage level between "gnd" and "vdd." As a consequence of this intermediate output voltage level, a subsequent device or circuit (e.g., inverter 505) connected to the output node 520 of the differential amplifier 504 may be biased such that a totem pole current flows in the circuit (e.g., through PFET device 519 and NFET device 521). Not only does this current consume additional power, but it may also bias the output 522 of the sense amplifier 500 to an intermediate voltage level, thus causing subsequent stages to similarly consume additional power. Moreover, small noise-induced oscillations, superimposed on this intermediate output voltage pedestal, could cause subsequent stages to ring.

To help avoid these undesirable effects, a latch circuit, or suitable equivalent (e.g., sample and hold, etc.), may be included in the sense amplifier 500, preferably following the output of the differential amplifier 504. In a conventional latch circuit, subsequent to the application of a latch signal or command, the input stage of the latch is preferably disabled and the output is essentially permanently held in its previous state (e.g., typically using a positive feedback arrangement) until the latch signal is disabled. In this manner, assuming the output of the differential amplifier is sampled at appropriate time intervals (i.e., when the output data is presumed to be valid), any ringing or noise present on the output of the differential amplifier, subsequent to latching the output state, will not be transferred to the output of the overall current sensing amplifier, thereby insuring the integrity of the output data.

Numerous latch circuits and configurations are known by those skilled in the art and include, for example, flip-flops and sample-and-hold circuits. In a preferred embodiment of the current sensing amplifier, the latch circuit is preferably used in place of the inverter stage 505, although it is to be appreciated that one or more inverter stages may be integrated with the latch circuit as well. At least one timing signal is preferably operatively connected to the latch circuit to enable the latch circuit to sample or strobe the signal on the output node of the differential amplifier at specific time intervals, preferably after a predetermined settling time has occurred (i.e., after the output 520 has had sufficient time to swing towards "vdd" or "gnd," and thus further develop into a "1" or "0" logic level, respectively).

A preferred embodiment of a current sensing amplifier which includes an equalization and integrated latch circuit is depicted in FIG. 7. In addition, FIG. 7 illustrates how the differential amplifier of FIG. 1 may be modified to include differential outputs 720 and 717, as appreciated by those skilled in the art. For example, in the text entitled *CMOS Analog Circuit Design*, by Phillip Allen and Douglas Holberg (1987), page 352, a differential amplifier having differential outputs is presented. The distinction between the topology described by Allen et al. and the differential amplifier in the embodiment of FIG. 7 is that the stated text describes how hysteresis is incorporated within the differential amplifier (referred to as a comparator by Allen, et al.), whereas in its use as differential amplifier 704, hysteresis is not employed. The same circuit topology is used in differential amplifier 704 for its symmetrical structure, its self-biasing characteristic and its differential outputs 717, 720. The present invention further contemplates that equalization circuitry (not shown) may be included in the differential amplifier 704, as similarly described above in connection with the preamplifier of FIG. 5, to provide enhanced performance.

With reference to FIG. 7, in this embodiment of the differential amplifier 704, the self-biasing, symmetric current source/load topology, described above in connection with the preamplifier of FIG. 4, is preferably employed. Hysteresis in the differential amplifier 704 is avoided by sizing the PFET devices forming the current source/load such that the W/L ratios of reference PFET devices 734 and 736 are equal to or greater than the W/L ratios of mirror PFET devices 732 and 738, respectively, as discussed herein above.

True and complement outputs, 720 and 717, of the differential amplifier 704 are preferably connected to and drive the latch circuit 705, which, in the preferred embodiment, comprises a differential input stage preferably formed of a pair of NFET devices 741 and 742. The voltage difference between nodes 720 and 717 is sampled once the write latch signal, "wlatch," connected to NFET pass gates 744 and 746, is asserted high. Of course, the present invention similarly contemplates that other latch enabling configurations may be used, as known by those skilled in the art. The assertion of "wlatch" effectively connects the input NFET devices 741, the two nodes 720 and 717 determines the relative pulldown strength of NFETs 741 and 742. For example if node 720 is greater than 717, NFET 741 will sink more current than NFET 742. The stored state of the static latch 748 is overwritten by tug of the most active NFET device, either 741 or 742. The pulldown leg comprising NFET device 741 and NFET device 744 (or pulldown leg comprising NFET device 742 and NFET device 746) is sized to be stronger than the pullup PFET device 758 (or PFET device 760) of the static latch 748. The most active pulldown leg controls the state of nodes 750 and 752. Thus, for example, if output node 720 has a higher voltage than output node 717, and "wlatch" is asserted, node 750 will be pulled to ground and node 752 will rise toward "VDD," no matter what the prior state of the latch 748 had been. Once "wlatch" is disabled (driven to ground), the positive feedback of the latch 748 will maintain the state of nodes 750 and 752 until the next time data is sampled by the assertion of "wlatch". In the preferred embodiment described herein, the static latch 748 is implemented as a pair of cross-coupled inverters, although any suitable equivalent latch configuration may be utilized, as appreciated by those skilled in the art.

As shown in FIG. 7, inverters 754 and 756 may be connected to the differential output nodes 750 and 752, respectively, of the overall latch circuit 705 to, among other things, buffer the outputs 722, 723, respectively, of the current sensing amplifier 700. It is to be appreciated that the present invention contemplates that equalization devices or circuits may be similarly connected between the latch output nodes, 750 and 752 (as in the preferred preamplifier embodiment of FIG. 4) to further improve the overall performance of the current sensing amplifier 700.

Figure 8:
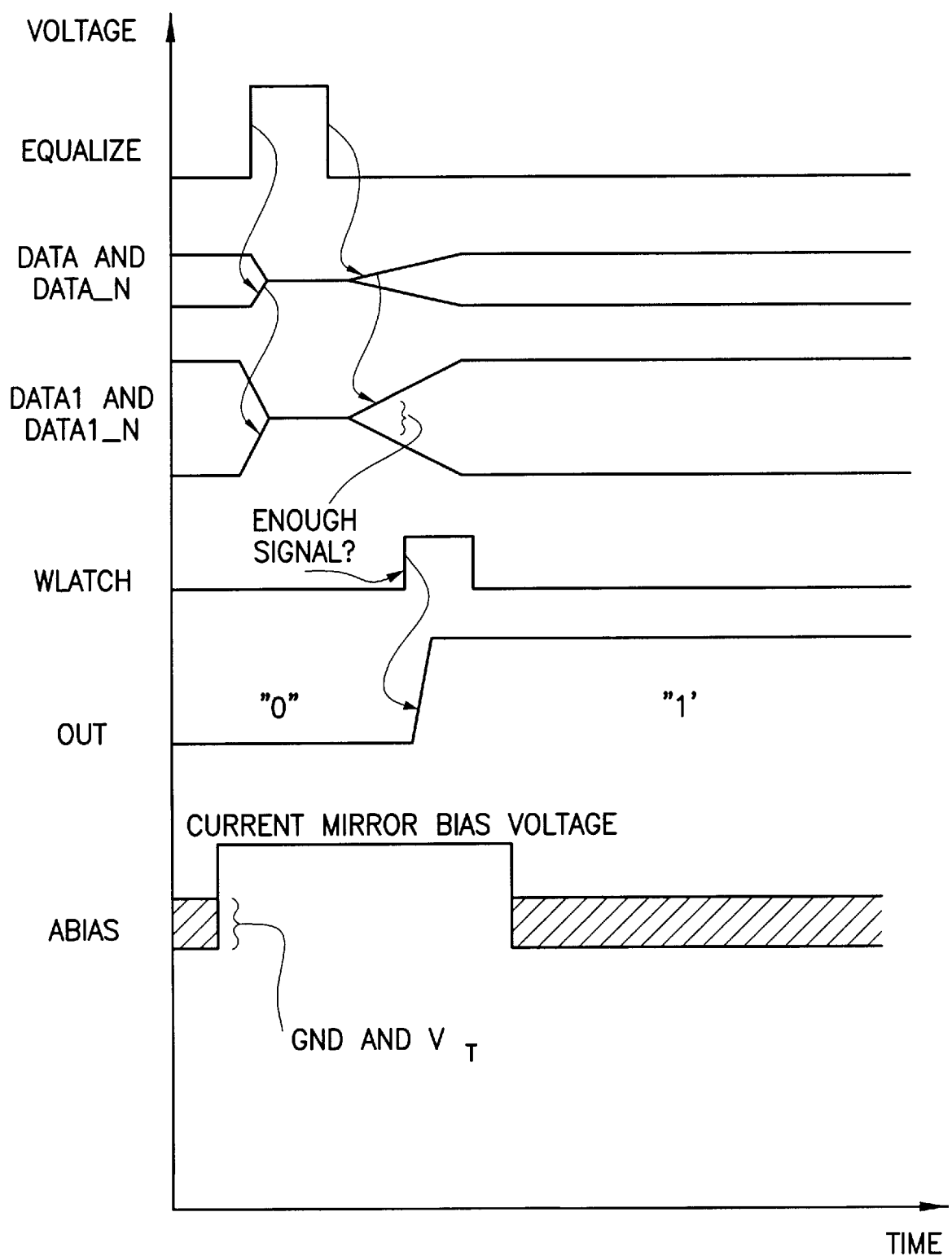
FIG. 8 is a logical timing diagram illustrating the logic state of various nodes of the current sensing amplifier depicted in FIG. 7, with respect to time.

A timing diagram for the current sensing amplifier of FIG. 7 is illustrated in FIG. 8. With reference to FIGS. 7 and 8, the equalization of the preamplifier output nodes 712, 714 is preferably triggered by a rising edge of the "equalize" pulse, which, in turn, triggers the subsequent equalization of the differential amplifier output nodes 720, 717. It should be noted that, with reference to the memory cell application example discussed above, equalization of the current sensing amplifier 700 is preferably initiated prior to the selection of the desired active memory cell by the decode logic (both word and bit lines).

A falling edge of the "equalize" signal is preferably timed to be substantially coincident with the selection of the active memory cell by the decode logic (with reference, again, to the memory cell application example). Once the current sensing amplifier is released from equalization (i.e., the "equalize" signal is disabled), the current sensing amplifier 700 is allowed to develop a difference voltage signal which represents the state of the variable resistance load connected thereto, first on the output nodes 712, 714 of the preamplifier 702, then an amplified version of the difference signal is developed on the output nodes 720, 717 of the differential amplifier 704. After a sufficient voltage difference has developed across the differential amplifier output nodes, 720 and 717, the latch signal, wlatch, is preferably asserted, thereby enabling the state of the amplifier to pass through to the output of the latch circuit 705. Once the latch signal, wlatch, falls (i.e., becomes inactive), the static latch 748 preferably maintains or stores the state (voltage level) of the amplifier, regardless of the input to the latch circuit 705. In essence, the sampled latch circuit 705 provides a means of decoupling the current sensing amplifier output signal from the unwanted effects of, for example, the equalization process.

In order to conserve power, one or more components of the current sensing amplifier 700 may be powered down at predetermined time intervals during which no sensing operation is required, assuming the current sensing amplifier 700 includes means for buffering the output from the input, such as provided by the sampled latch circuit 705. For example, the differential amplifier 704 may be powered down, preferably by removing its bias voltage "abias" at node 726. The addition of a gated bias signal, "abias," as shown in FIG. 8, illustrates how the differential amplifier 704 may be powered down during times of inactivity which could, for example, include dead times within a memory read cycle. During its inactive phase, the "abias" signal is preferably lowered to a voltage level below the threshold voltage (VT) of the tail NFET device 740, although other powerdown approaches are similarly contemplated by the present invention. The present invention additionally contemplates other functional blocks comprising the current sensing amplifier may be powered down in a similar manner to provide further power savings. For example, the preamplifier 702 may be powered down, preferably by gating the bias signal "rbias."

FIG. 9 illustrates an alternative embodiment of the current sensing amplifier of the present invention which includes means for providing equalization and for reducing the effects of intermediate state generation during equalization. With reference now to FIG. 9, the current sensing amplifier 900 preferably comprises a preamplifier stage 902 with an equalization NFET device 927 (but no hysteresis) and a differential amplifier 904. The differential amplifier 904 used in this embodiment preferably includes hysteresis by appropriately sizing the FET devices, as appreciated by those skilled in the art.

During equalization, the output nodes 912, 914 of the preamplifier 902 are preferably connected together through the equalization NFET device 927. Unlike in the prior embodiments of the differential amplifier previously discussed above, the output node 920 of the differential amplifier with hysteresis 904 (see, e.g., *CMOS Analog Circuit Design*, by Phillip Allen and Douglas Holberg, 1987, pg. 352) preferably retains its prior state, thereby eliminating intermediate state generation, since it is designed to resist changes at the input of the differential amplifier 904 until after a sufficient voltage difference (ΔVin) has developed at the output nodes 912, 914 of the preamplifier 902. As evident by the graphical plot of output voltage "out" (i.e., node 920) versus differential input voltage, ΔVin (i.e., node 912–node 914), depicted in FIG. 10, the differential amplifier 904 does not change state until a sufficiently large voltage difference, beyond the equalization point, is developed.

Figure 10:
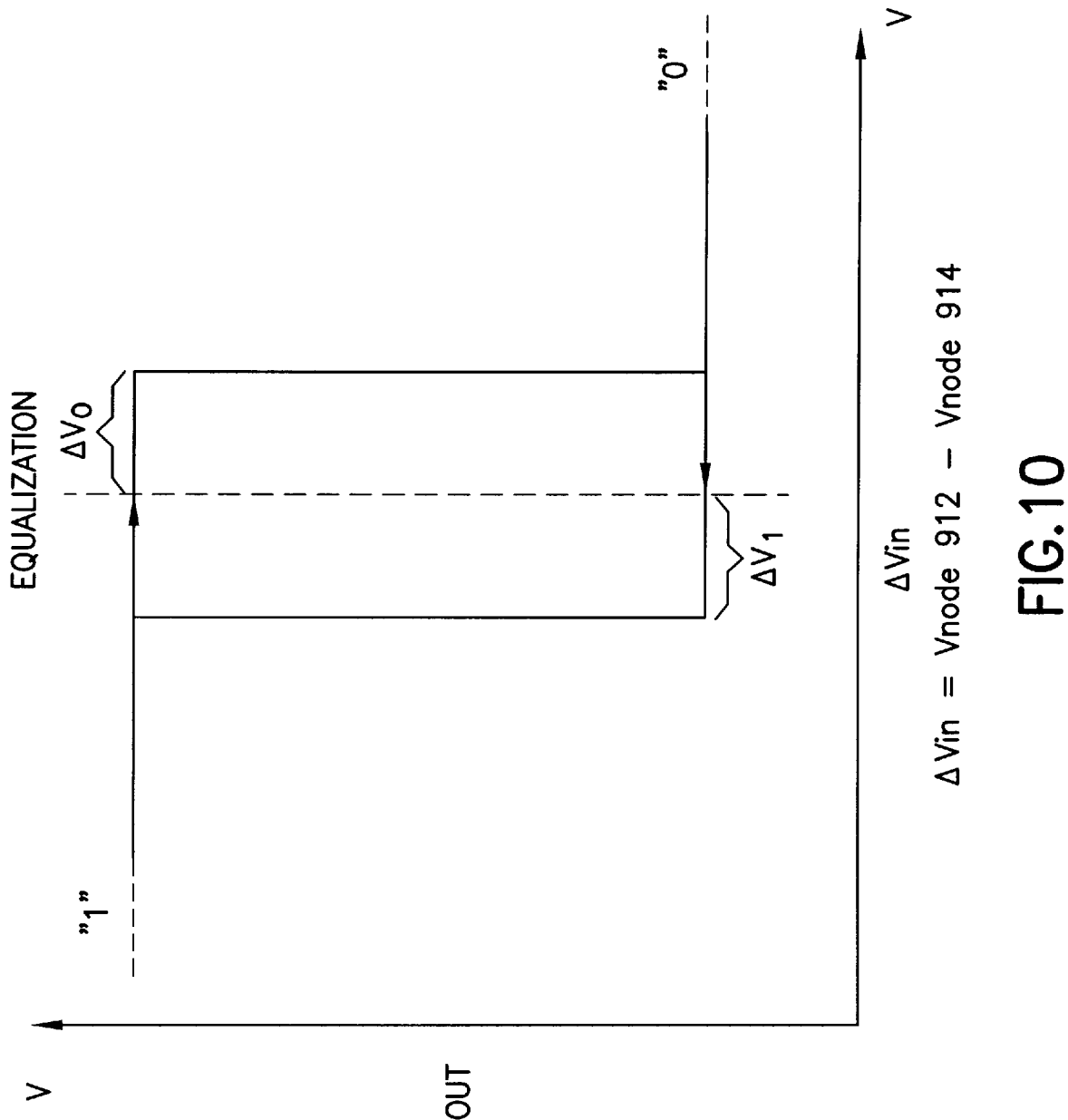
FIG. 10 is a graphical representation illustrating an output transfer response of the differential amplifier depicted in FIG. 9.

To realize an adequate transient response for the overall current sensing amplifier 900 of FIG. 9, the design objective is preferably to minimize the voltage difference required to change the output from a "0" logic state to a "1" logic state, defined as ΔV1 in FIG. 10, and likewise to change the output from a "1" logic state to a "0" logic state, defined as ΔV0 in FIG. 10, all the while insuring under worst case process mismatch that the equalization process will not generate an intermediate output state.

EXAMPLE

Memory Read Application

Figure 11:
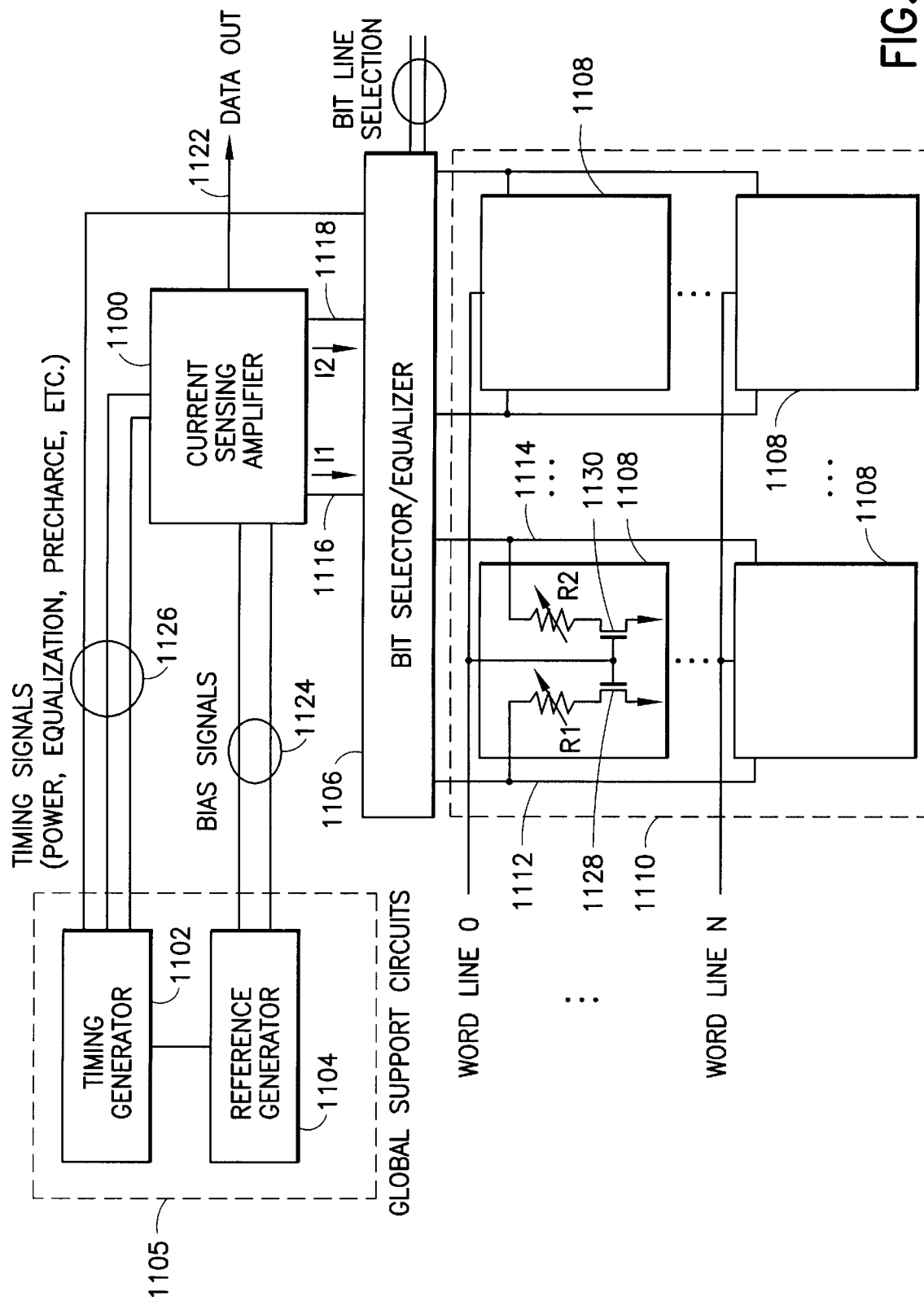
FIG. 11 is a block diagram illustrating an example application of the current sensing amplifier, formed in accordance with the present invention, wherein the current sensing amplifier is operatively connected in a memory system for reading the state of one or more twin memory cells in a memory array.
Figure 12:
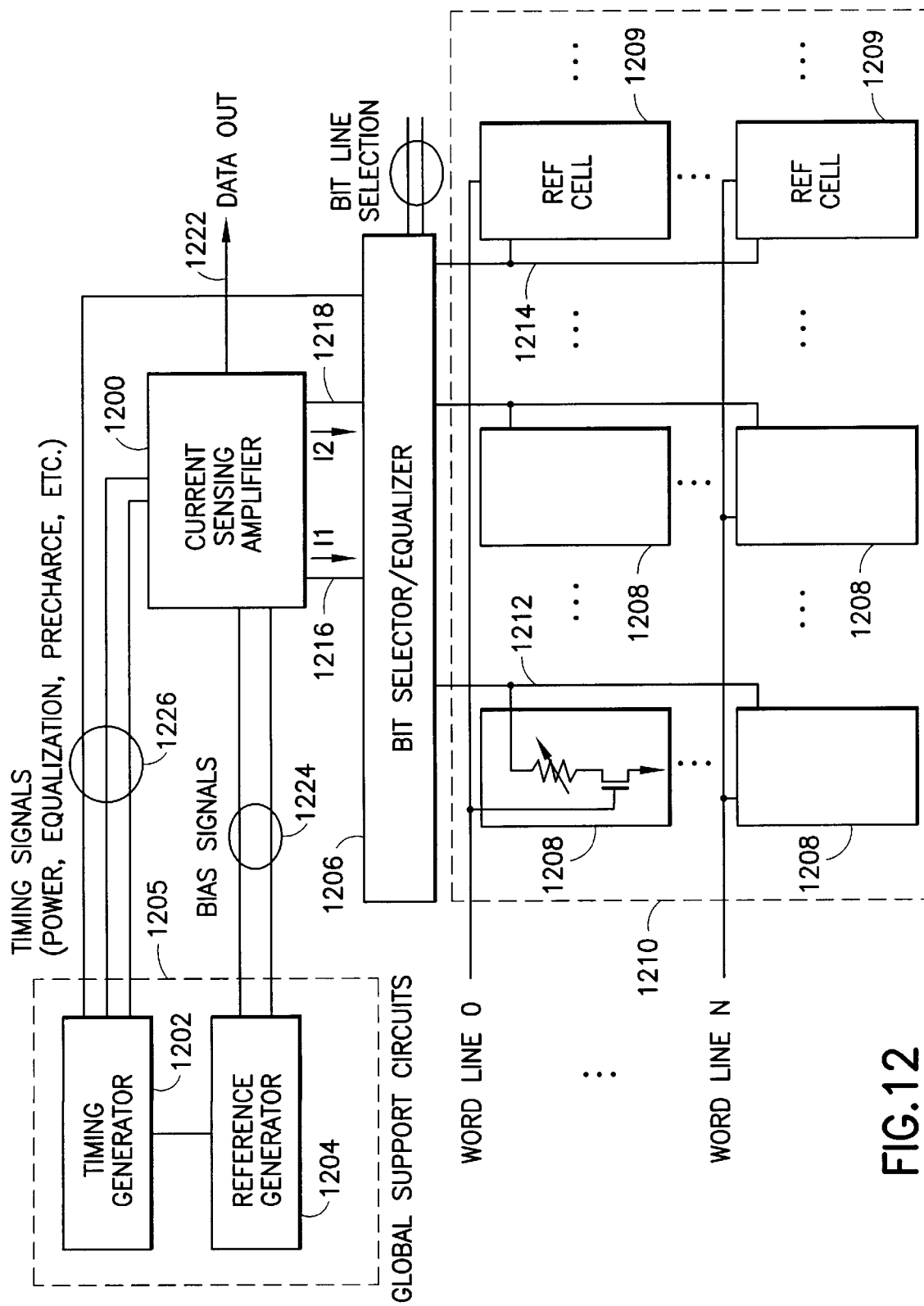
FIG. 12 is a block diagram illustrating an example application of the current sensing amplifier, formed in accordance with the present invention, wherein the current sensing amplifier is operatively connected in a memory system for reading the state of one or more memory cells in a memory array, used in conjunction with one or more reference memory cells.

By way of example only, one application of the current sensing amplifier formed in accordance with the present invention, is illustrated in FIGS. 11 and 12, which depicts the current sensing amplifier configured with a memory structure. In this application, the current sensing amplifier of the present invention may be used to sense the binary state of one or more memory cells (either as a twin cell arrangement, or as a single cell plus a reference cell arrangement), with each memory cell preferably acting as the variable resistance load to which the current sensing amplifier is connected. The state of the memory cell, in this case, may be defined as a predetermined change in resistance of the cell. One example of a memory cell might comprise a magnetic tunnel junction (MTJ) storage element connected in series with a FET selection switch. FIG. 11 describes a twin cell memory sensing configuration, while FIG. 12 describes a single cell sensing arrangement.

FIG. 11 depicts a memory array 1110 comprised of a plurality of individual memory cells 1108 connected through a bit selector 1106 to a current sensing amplifier 1100. It is to be appreciated that, depending upon which embodiment of the current sensing amplifier of the present invention is used, a reference generator circuit 1104 and/or a timing generator circuit 1102 may also be operatively connected to the amplifier 1100 for supplying the bias signal(s) 1124 and/or timing signal(s) 1126, respectively, as required.

Preferably, each dual memory cell 1108 has two paths or legs for current to follow. The first current path, traced from the negative voltage supply (e.g., ground) to a first bit line 1112, comprises an NFET switch 1128 connected in series with a variable resistor element R1. The second current path, traced from the negative voltage supply to a second bit line 1114, comprises an NFET switch 1130 connected in series with a variable resistor element R2. Variable resistor R1 and its complement resistor R2 may have two possible values, either R or R+ΔR. The dual memory cell 1108 is preferably written in such a way that the two variable resistors R1 and R2 always have opposite resistance values. Therefore, for example, if variable resistor R1 is set to R, then variable resistor R2 is set to R+ΔR. An active high signal on a particular word line selects that row of memory cells connected to that word line, and the active cell 1108 on each bit line may be selected by turning on its corresponding NFET devices, 1128, 1130, for example.

With continued reference to FIG. 11, the bit selector 1106, which may be implemented by a multiplexer, preferably connects a pair of bit lines, for example, 1112 and 1114, directly to the data input lines, 1116 and 1118, respectively, that feed the core current sensing amplifier 1100. The bit selector 1106 preferably comprises pass gate elements (e.g., FETs) that do not significantly alter the bit line voltages, so that circuit node 1116 has substantially same potential as bit line 1112, and likewise node 1118 has substantially the same potential as bit line 1114. It should be appreciated that, in accordance with the present invention, bit selector 1106 may include equalization circuitry, such that, just prior to performing a current sensing operation, amplifier input nodes 1116, 1118 and/or the selected bit lines (e.g., 1112, 1114) may be temporarily connected together to achieve higher read performance, as discussed previously in reference to the current sensing amplifier embodiment of FIG. 5.

As discussed above in connection with the preamplifier component of the current sensing amplifier of the present invention, input nodes 1116 and 1118 are essentially clamped to a fixed voltage by the core sensing amplifier 1100. Thus, ideally the fixed voltage appears across the variable resistors R1 and R2 of a selected memory cell 1108. The two currents, designated I1 and I2, preferably follow two separate but substantially equal paths (only seeing the difference in the twin cell variable resistors) flowing from the differential inputs 1116, 1118 of the sensing amplifier 1100, through the bit selector 1106, bit lines (e.g., 1112, 1114), and finally down each leg of the corresponding selected memory cell 1108. Since the variable resistors have high and low values associated therewith, and the applied voltage across each of them is substantially the same, a difference in current, ΔI (e.g., I1–I2), can be detected between the separate legs of the cell 1108. The sign (i.e., positive or negative) of ΔI holds the binary state information for the particular memory cell being sensed. Extracting this state is one function of the current sensing amplification scheme described herein.

It is to be appreciated that the current sensing amplification scheme may be divided into two principal components, namely, the core current sensing amplifier 1100 and global support circuitry 1105, which may or may not be required. In a preferred memory system design, the current sensing amplifier 1100 and bit selector 1106 are replicated in accordance with the total bit width N, desired from the memory array 1110 to be sensed. A plurality of current sensing amplifiers may be driven by common global support circuitry 1105. Alternatively, each current sensing amplifier 1100 may be driven by its own corresponding support circuitry 1105. In either case, such support circuitry 1105 preferably provides bias and timing signals to the current sensing amplifier 1100 in an area-efficient manner, thereby reducing the susceptibility of the overall memory system to process-dependent variations and errors.

Actual grouping of circuits into core and support functions depends, at least in part, on internal power supply fluctuations (e.g., ground bounce) and device tracking issues such as threshold voltage and channel length mismatch, as appreciated by those skilled in the art. For example, voltage differences of 20 mV or less can cause an error in sensing MTJ-based memory cells having a 200 mV bias voltage and a 10% magneto resistance difference. Thus, for example, in a single memory cell sensing arrangement, some reference generator circuits may reside within the current sensing amplifier, even though they can be theoretically shared among more than one sense amplifier. More sensitive reference circuits may be replicated locally and shared among adjacent sensing amplifiers as desired, if not on a one for one basis with the amplifier stages.

A single memory cell analog to the dual cell sensing approach of FIG. 11 is depicted in FIG. 12. In this scheme, one or more "dummy" reference cells 1209 is preferably included and operatively connected to one of the inputs of the current sensing amplifier 1200. The addition of the dummy reference cell 1209 is required in order to provide reference currents to the current sensing amplifier 1200 so that the amplifier is preferably able to establish an internal reference signal midway between a logic "1" and a logic "0" to compare with an actual memory cell 1208 to be measured. In the example application of FIG. 12, the dummy reference cell 1209 is connected to the current sensing amplifier 1200 through input node 1218 via bit selector 1206, in a similar manner as a memory cell 1208 is connected to input node 1216 of the current sensing amplifier 1200. It is to be appreciated, however, that dummy reference cell 1209 may be integrated internally with the current sensing amplifier 1200, and therefore connection via the bit selector 1206 may be eliminated.

With continued reference to FIG. 12, a scheme is shown in which the current sensing amplifier 1200 is preferably used to detect the binary state of a single memory cell 1208, wherein the reference cells 1209 have been integrated within the memory array 1210 to further improve tracking and read performance. The reference bit line 1214, which connects the bit selector 1206 to the reference cells 1209, insures that a reference cell 1209 is connected to one of the input nodes (1216 or 1218) of the sense amplifier 1200, while the single memory cell to be measured is connected to other input of the sense amplifier 1200.

A current sensing amplifier formed in accordance with the present invention detects small variations in current between at least two resistances. The present invention provides a current sensing amplifier that is capable of high speed current comparison between the two resistances. Additionally, the present invention provides a current sensing amplifier that is small in physical dimensions, thereby being advantageously adapted for use in random access memory applications, where integrated circuit density is critical. Moreover, by employing a symmetrical configuration for the current sensing amplifier, in at least one aspect, the effects of integrated circuit processing variations are reduced.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the present invention.

What is claimed is:

1. A current sensing amplifier for detecting a current difference between a pair of variable resistance loads, said current sensing amplifier comprising:
    a first amplifier comprising:
        a voltage clamp including first and second outputs, said voltage clamp being operatively coupled to said pair of variable resistance loads, the voltage clamp substantially fixing a predetermined voltage across said variable resistance loads and transferring said current difference to the first and second outputs; and
        a differential current source operatively coupled to the first and second outputs; and
    a second amplifier, said second amplifier including first and second inputs and an output, the first input being operatively coupled to the first output of said first amplifier and the second input being operatively coupled to the second output of said first amplifier.

2. The current sensing amplifier of claim 1, further comprising a bias generator operatively coupled to said voltage clamp, the bias generator producing a predetermined bias output voltage that establishes an operating point of said voltage clamp.

3. The current sensing amplifier of claim 2, wherein:
    the current source comprises first and second transistors, each of said first and second transistors having a gate, a source and a drain terminal, said first and second transistors being operatively connected together such that the current source generates a first reference current and a second reference current, said first and second reference currents being substantially equal to each other; and
    the voltage clamp comprises third and fourth transistors, each of said third and fourth transistors having a gate, a source and a drain terminal, the gate terminals of the third and fourth transistors being connected to said bias generator, the drain terminals of the third and fourth transistors being operatively connected to said current source, and the source terminals of the third and fourth transistors being operatively connected to said pair of variable resistance loads.

4. The current sensing amplifier of claim 3, further comprising a second bias generator operatively connected to the gate terminals of said first and second transistors, said second bias generator producing a voltage which establishes a predetermined current value for said first and second reference currents.

5. The current sensing amplifier of claim 1, further comprising a buffer including an input and an output, the input of said buffer being operatively connected to the output of said second amplifier.

6. The current sensing amplifier of claim 1, wherein:
    said current source comprises first and second current mirrors, each of said first and second current mirrors including first and second outputs and generating a reference current at said first output and a mirrored current at said second output, wherein the first output of said first amplifier is formed at the junction of the first output of the first current mirror and the second output of said second current mirror, and the second output of said first amplifier is formed at the junction of the second output of the first current mirror and the first output of the second current mirror.

7. The current sensing amplifier of claim 6, wherein each of said first and second current mirrors includes a reference transistor and a mirror transistor, each of said reference and mirror transistors having a gate, a source, and a drain terminal, wherein in each of said first and second current mirrors, the source terminals of the reference and mirror transistors are connected to a positive voltage supply, the gate and drain terminals of the reference transistors and the gate terminal of the mirror transistor are connected together and form the first outputs of said first and second current mirrors, and the drain terminal of the mirror transistors form the second outputs of said first and second current mirrors.

8. The current sensing amplifier of claim 1, further comprising:
an equalization circuit operatively connected between said first and second outputs of the first amplifier, said equalization circuit substantially minimizing a voltage difference between said first and second outputs of said first amplifier in response to an equalization activation signal applied to said equalization circuit.

9. The current sensing amplifier of claim 8, wherein said equalization circuit comprises an equalization transistor having a gate terminal, a drain terminal and a source terminal, the drain and source terminals of said equalization transistor being operatively connected to the first and second outputs of said first amplifier and said equalization activation signal being applied to the gate of said equalization transistor.

10. The current sensing amplifier of claim 1, wherein said second amplifier includes a second output and said current sensing amplifier further comprises:
an equalization circuit operatively connected between said first and second outputs of the second amplifier, said equalization circuit substantially minimizing a voltage difference between said first and second outputs of said second amplifier in response to an equalization activation signal applied to said equalization circuit.

11. The current sensing amplifier of claim 10, wherein said equalization circuit comprises an equalization transistor having a gate terminal, a drain terminal and a source terminal, the drain and source terminals of said equalization transistor being operatively connected to the first and second outputs of said second amplifier and said equalization activation signal being applied to the gate of said equalization transistor.

12. The current sensing amplifier of claim 1, further comprising:
a latch circuit including an input and an output, the input of said latch circuit being operatively coupled to the output of said second amplifier, said latch circuit sampling a logic state at the input of said latch circuit and maintaining said logic state on the output of said latch circuit in response to a latch enable signal applied to said latch circuit.

13. The current sensing amplifier of claim 12, wherein said latch circuit comprises:
a pair of inverters, each inverter having an input and an output, the input of each inverter being operatively coupled to the output of the other inverter; and a pass transistor, said pass transistor being operatively connected between the output of the second amplifier and the input of one of the inverters of said pair of inverters, said pass transistor substantially connecting the output of the second amplifier to the input of one of the inverters of said pair of inverters in response to said latch enable signal operatively coupled to said pass transistor.

14. The current sensing amplifier of claim 12, further comprising a buffer circuit including an input and an output, the input of said buffer circuit being operatively coupled to the output of said latch circuit.

15. The current sensing amplifier of claim 12, wherein said second amplifier includes a second output and said current sensing amplifier further comprises at least one equalization circuit operatively connected between at least one of:
(i) said first and second outputs of the first amplifier; and
(ii) said first and second outputs of the second amplifier,
said at least one equalization circuit substantially minimizing a voltage difference between said first and second outputs of at least one of said first amplifier and said second amplifier in response to an equalization activation signal applied to said at least one equalization circuit.

16. The current sensing amplifier of claim 8, wherein said second amplifier includes hysteresis for minimizing a sensitivity of said second amplifier to changes at the outputs of said first amplifier.

17. The current sensing amplifier of claim 2, further comprising:
a power down circuit operatively connected to at least one of said first amplifier and said second amplifier, said power down circuit substantially reducing an operating current of said current sensing amplifier in response to a power down signal applied to said power down circuit.

18. The current sensing amplifier of claim 17, wherein said power down circuit includes means for deactivating said bias generator in response to said power down signal.

19. A memory system comprising:
a plurality of memory cells operatively connected in an array, each of said memory cells having a first resistance value corresponding to a first logic state of said memory cell and a second resistance value corresponding to a second logic state of said memory cell;
a bit selector operatively connected to said plurality of memory cells, said bit selector including at least one bit selector input and selecting at least one memory cell in response to a bit selection signal applied to said at least one bit selector input;
a current sensing amplifier including first and second inputs and an output, the first and second inputs of said current sensing amplifier being operatively connected to at least one of said plurality of memory cells through said bit selector, said current sensing amplifier measuring a difference in resistance between a memory cell to be read and a reference cell, said memory cell to be read and said reference being operatively connected to the first and second inputs of said current sensing amplifier, said memory cell to be read being selected from said plurality of memory cells by an enable signal applied to the memory cell to be read, the output of said current sensing amplifier indicating a logic state of the memory cell to be read.

20. The memory system of claim 19, wherein each of said plurality of memory cells comprises at least one magnetic tunnel junction device for storing a binary logic state of said memory cell.

21. The memory system of claim 19, wherein the current sensing amplifier further comprises:

at least one timing signal input; and timing circuitry responsive to at least one timing signal applied to said at least one timing signal input, said timing circuitry including at least one of:

(i) a power down circuit operatively connected to the current sensing amplifier, said power down circuit substantially reducing an operating current of said current sensing amplifier in response to said at least one timing signal applied to said power down circuit; and (ii) an equalization circuit operatively connected to the current sensing amplifier, said equalization circuit minimizing a voltage difference between at least one pair of predetermined internal nodes of said current sensing amplifier in response to said at least one timing signal applied to said equalization circuit.

22. The memory system of claim 21, wherein said timing circuitry further includes a latch circuit including an input and an output, the input of said latch circuit being operatively coupled to said current sensing amplifier, said latch circuit sampling a logic state at the input of said latch circuit and maintaining said logic state on the output of said latch circuit in response to said at least one timing signal applied to said latch circuit.

23. A current sensing amplifier for detecting a current difference between a pair of magnetic tunnel junction devices in a memory array, said current sensing amplifier comprising:

a first amplifier comprising:

a voltage clamp including first and second outputs, said voltage clamp being operatively coupled to said pair of magnetic tunnel junction devices, the voltage clamp substantially fixing a predetermined voltage across said magnetic tunnel junction devices and transferring said current difference to the first and second outputs; and a differential current source operatively coupled to the first and second outputs; and a second amplifier, said second amplifier including first and second inputs and an output, the first input being operatively coupled to the first output of said first amplifier and the second input being operatively coupled to the second output of said first amplifier.

* * * * *